(12) United States Patent
Choi et al.

(10) Patent No.: US 9,728,539 B2
(45) Date of Patent: Aug. 8, 2017

(54) MULTI BIT CAPACITORLESS DRAM AND MANUFACTURING METHOD THEREOF

(71) Applicant: Korea Advanced Institute of Science And Technology, Daejeon (KR)

(72) Inventors: Yang-Kyu Choi, Daejeon (KR); Jun-Young Park, Daejeon (KR); Byung-Hyun Lee, Daejeon (KR); Dae-Chul Ahn, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/044,702

(22) Filed: Feb. 16, 2016

(65) Prior Publication Data
US 2017/0162579 A1    Jun. 8, 2017

(30) Foreign Application Priority Data

Dec. 8, 2015  (KR) .......................... 10-2015-0174252
Dec. 21, 2015  (KR) .......................... 10-2015-0182736

(51) Int. Cl.
*G11C 11/24*  (2006.01)
*H01L 27/108*  (2006.01)
(Continued)

(52) U.S. Cl.
CPC ...... *H01L 27/10802* (2013.01); *G11C 7/1072* (2013.01); *G11C 11/409* (2013.01);
(Continued)

(58) Field of Classification Search
CPC ...................................................... G11C 11/24
(Continued)

(56) References Cited

U.S. PATENT DOCUMENTS 6,804,142 B2 * 10/2004 Forbes .................. G11C 11/405
                                                                257/300
6,873,539 B1 *  3/2005 Fazan .................... G11C 11/403
                                                                365/149
(Continued)

FOREIGN PATENT DOCUMENTS

KR    10-2015-0099217 A    8/2015

OTHER PUBLICATIONS

Choi, S. et al. "A Novel Junctionless All-Around-Gate SONOS Device with a Quantum Nanowire on a Bulk Substrate for 3D Stack NAND Flash Memory". Symposium on VLSI Technology, Digest of Technical Papers, 2011, pp. 74-75.
(Continued)

*Primary Examiner* — Harry W Byrne
(74) *Attorney, Agent, or Firm* — Foley & Lardner LLP

(57) ABSTRACT

A multi-bit capacitorless DRAM according to the embodiment of the present invention may be provided that includes: a substrate; a source and a drain formed on the substrate; a plurality of nanowire channels formed on the substrate; a gate insulation layer formed in the plurality of nanowire channels; and a gate formed on the gate insulation layer. Two or more nanowire channels among the plurality of nanowire channels have different threshold voltages. Each of the nanowire channels includes: a silicon layer; a first epitaxial layer which is formed to surround the silicon layer; and a second epitaxial layer which is formed to surround the first epitaxial layer. As a result, the high integration multi-bit capacitorless DRAM which operates at multi-bits can be implemented and a performance of accumulating excess holes can be improved by using energy band gap.

20 Claims, 30 Drawing Sheets

(51) Int. Cl.
*H01L 29/06* (2006.01)
*H01L 29/165* (2006.01)
*H01L 29/16* (2006.01)
*H01L 29/161* (2006.01)
*H01L 21/265* (2006.01)
*H01L 21/308* (2006.01)
*H01L 21/02* (2006.01)
*H01L 29/423* (2006.01)
*G11C 11/409* (2006.01)
*G11C 7/10* (2006.01)

(52) U.S. Cl.
CPC .. *H01L 21/02529* (2013.01); *H01L 21/02532* (2013.01); *H01L 21/26513* (2013.01); *H01L 21/3081* (2013.01); *H01L 21/3086* (2013.01); *H01L 29/0673* (2013.01); *H01L 29/161* (2013.01); *H01L 29/165* (2013.01); *H01L 29/1608* (2013.01); *H01L 29/42392* (2013.01)

(58) Field of Classification Search
USPC .... 365/46, 94, 100, 129, 148, 149, 158, 163
See application file for complete search history.

(56) References Cited

U.S. PATENT DOCUMENTS

| | | | | |
|---|---|---|---|---|
| 6,975,531 B2* | 12/2005 | Forbes | .................. | G11C 11/405 257/300 |
| 7,151,690 B2* | 12/2006 | Forbes | .................. | G11C 11/405 257/300 |
| 8,134,867 B2* | 3/2012 | Carman | ................ | G11C 7/1006 365/149 |
| 8,194,471 B2* | 6/2012 | Widjaja | ................. | G11C 11/404 365/149 |
| 8,547,756 B2* | 10/2013 | Widjaja | ................. | G11C 11/404 365/149 |
| 8,787,085 B2* | 7/2014 | Widjaja | ................. | G11C 11/404 365/149 |
| 8,817,548 B2* | 8/2014 | Widjaja | ................. | G11C 11/404 365/149 |
| 9,412,816 B2 | 8/2016 | Yang et al. | | |

OTHER PUBLICATIONS

Choi, S. et al. "Nonvolatile Memory by All-Around-Gate Junctionless Transistor Composed of Silicon Nanowire on Bulk Substrate." IEEE Electron Device Letters, vol. 32, No. 5, May 2011, pp. 602-604.

Office Action dated May 1, 2017 in related Korean Appl. No. 10-2015-0174252 (7 pgs.).

Office Action dated May 1, 2017 in related Korean Appl. No. 10-2015-0182736 (9 pgs.).

\* cited by examiner

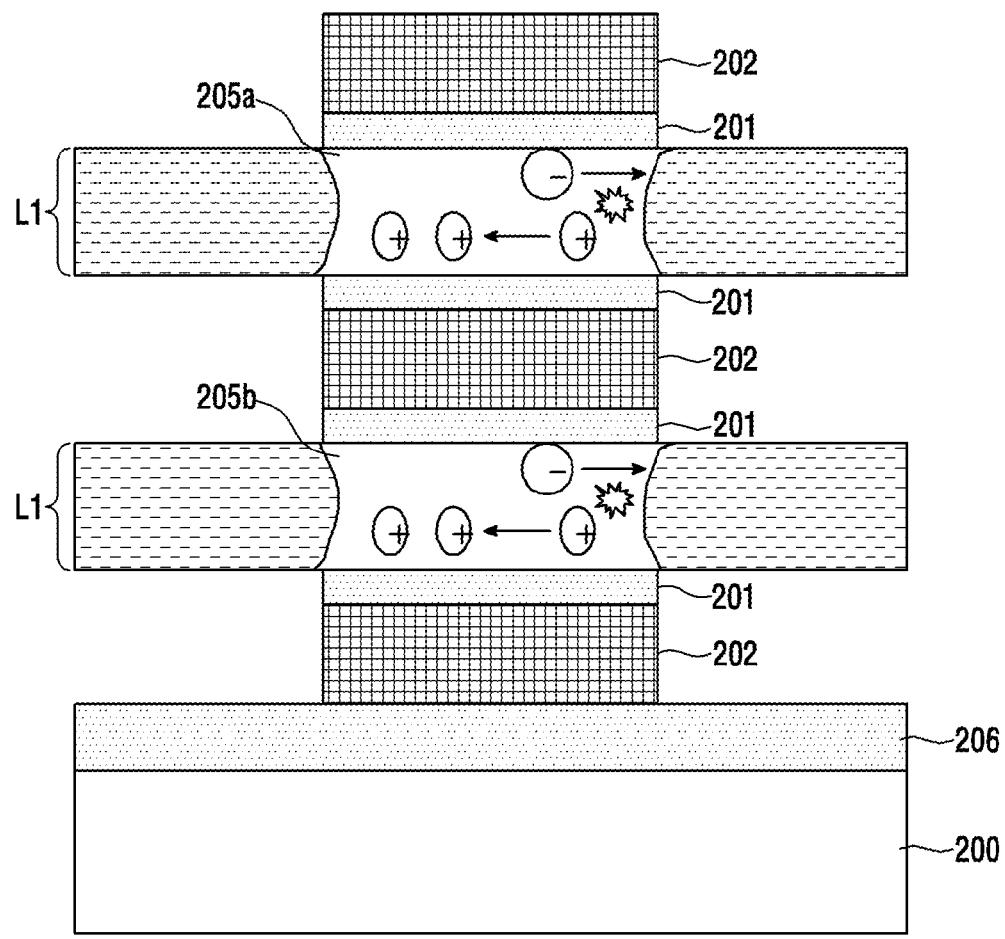

MULTI BIT CAPACITORLESS DRAM AND MANUFACTURING METHOD THEREOF

CROSS-REFERENCE TO RELATED PATENT APPLICATIONS

The present application claims the benefit of Korean Patent Application Serial No. 10-2015-0174252 filed on Dec. 8, 2015 and Korean Patent Application Serial No. 10-2015-0182736 filed on Dec. 21, 2015; the entireties of which are all incorporated herein by reference.

BACKGROUND

Field

This disclosure relates to a capacitorless DRAM, and more particularly to a capacitorless DRAM capable of implementing multi-bit and a manufacturing method thereof.

Description of the Related Art

A dynamic random access memory (DRAM), i.e., one of semiconductor parts which are necessarily used in computing, consists of one transistor and one capacitor. However, in a conventional DRAM, the size of the capacitor should become smaller with the reduction of the size of the device. Therefore, it has been believed that it is difficult to obtain a capacitor having a sufficiently high capacitance. Also, when an embedded chip is formed together with other devices, a process of forming the capacitor acts as an obstacle due to a high level difference of the capacitor. Therefore, attention is paid to a capacitorless DRAM capable of storing data without the capacitor which causes complex processes. Since the capacitorless DRAM does not use the capacitor, it has big advantages in terms of a degree of integration and the manufacturing cost thereof, compared with the conventional DRAM.

FIG. 1a is a cross sectional view showing schematically an operation principle of a conventional capacitorless DRAM. FIG. 1b is an energy band diagram of the conventional capacitorless DRAM. The capacitorless DRAM is manufactured by using a floating body device and a Silicon-On-Insulator (SOI) substrate or a common silicon bulk substrate. A predetermined voltage is applied to a gate 2 and a drain 4 of the transistor, so that excess holes are generated in the channel of the drain 4 by impact ionization 9. Since there is no outlet which allows the generated excess holes to escape, they are accumulated within a body 5. As compared with the transistor where the body 5 does not have the hole, the transistor having the accumulated holes has differences in a threshold voltage and a current level. Here, a state '0' and a state '1' are distinguished by using the differences.

A state where the holes have been accumulated within the body 5 is referred to as the state '1'. A state where all the holes have escaped from within the body 5 is referred to as the state '0'. That is, data of the conventional capacitorless DRAM could exist only in two states, i.e., the state '0' and the state '1'. This means that only one bit of information can be stored. In other words, since the conventional capacitorless DRAM has a structural limit that has only one body region (channel region), it cannot operate at greater than 2 bits.

SUMMARY

One embodiment is a multi-bit capacitorless DRAM including: a substrate; a source and a drain formed on the substrate; a plurality of nanowire channels formed on the substrate; a gate insulation layer formed in the plurality of nanowire channels; and a gate formed on the gate insulation layer. Two or more nanowire channels among the plurality of nanowire channels have different threshold voltages.

The two or more nanowire channels may have different threshold voltages by changing at least one of a kind, depth, concentration, and angle of a doped ion.

The two or more nanowire channels may have different threshold voltages by changing a shape or area of the cross-section of each of the nanowire channels.

The two or more nanowire channels may have different shapes or areas of the cross-sections thereof by changing at least one of a kind and a concentration of an etching material, an etching time period, a degree of a vacuum, and an etching temperature.

Each of the nanowire channels may include: a silicon layer; a first epitaxial layer which is formed to surround the silicon layer; and a second epitaxial layer which is formed to surround the first epitaxial layer.

The first epitaxial layer may be a $Si_{1-x}Ge_x$ layer grown by epitaxy.

The first epitaxial layer may be a $Si_{1-x}C_x$ layer grown by epitaxy.

The second epitaxial layer may be a silicon layer grown by epitaxy.

Each of the nanowire channels may include: a first silicon layer; and a second silicon layer which is formed to surround the first silicon layer.

The first silicon layer may be a silicon layer p-type doped from n-type by an ion implantation process.

The second silicon layer may be a p-type silicon layer into which an ion is not implanted.

The multi-bit capacitorless DRAM further includes: a controller which controls operations of the multi-bit capacitorless DRAM; and a storage unit which stores a driving voltage for each of the plurality of nanowire channels, wherein the driving voltage is based on threshold voltages of the plurality of nanowire channels. The controller may control a driving voltage which is applied to at least one of the gate and the drain, and may program or erase two or more bit data.

Another embodiment is a method for manufacturing a multi-bit capacitorless DRAM. The method includes: (a) depositing a hard mask on a substrate; (b) etching at least a portion of the hard mask; (c) patterning a nanowire on the substrate by anisotropic etching; (d) forming a passivation layer on the substrate; (e) forming a nanowire channel on the substrate by isotropic etching; (f) forming a plurality of the nanowire channels by repeatedly performing the steps (c) to (e); and (g) forming a source, a drain and a gate. The plurality of nanowire channels are processed to have different threshold voltages respectively by the step (f).

In the step (f), every time when each nanowire channel is formed, dopant is implanted with the change of at least one of a kind, depth, concentration, and implantation angle of a doped ion, so that the plurality of nanowire channels may have different threshold voltages respectively.

In the step (f), every time when each nanowire channel is formed, at least one of a kind and concentration of an etching material, etching time period, a degree of a vacuum, and an etching temperature is changed, so that the plurality of nanowire channels may have different threshold voltages respectively.

In the step (f), a first epitaxial layer and a second epitaxial layer may be formed in the plurality of nanowire channels.

The first epitaxial layer may be a $Si_{1-x}Ge_x$ layer which surrounds the nanowire channel and is grown by epitaxy.

The first epitaxial layer may be a $Si_{1-x}C_x$ layer which surrounds the nanowire channel and is grown by epitaxy.

The second epitaxial layer may be a silicon layer which surrounds the first epitaxial layer and is grown by epitaxy.

In the step (f), an n-type silicon layer may be formed in each of the plurality of nanowire channels by an ion implantation process.

BRIEF DESCRIPTION OF THE DRAWINGS

FIG. 2b is a cross sectional view of the multi-bit capacitorless DRAM, taken along line A-A' of FIG. 2a;

FIG. 13a is a cross sectional view of the above-described multi-bit capacitorless DRAM;

FIG. 13b is an energy band diagram of the multi-bit capacitorless DRAM having the structure shown in FIG. 13a;

DETAILED DESCRIPTION

Figure 1A:
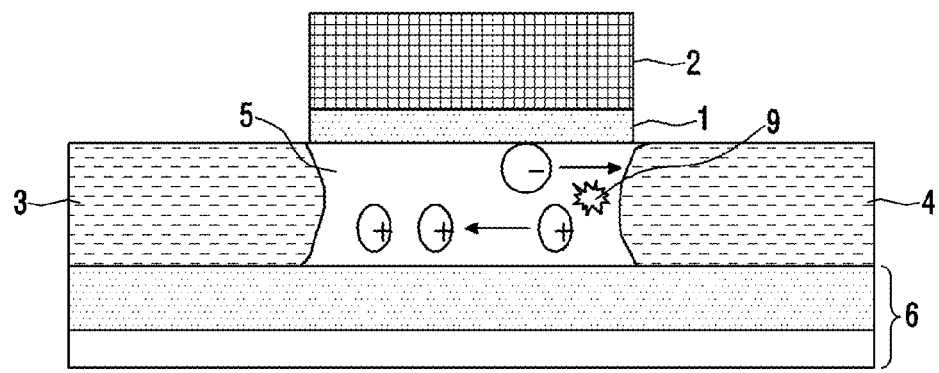
FIG. 1a is a cross sectional view mimetically showing an operation principle of a conventional capacitorless DRAM.
Figure 1B:
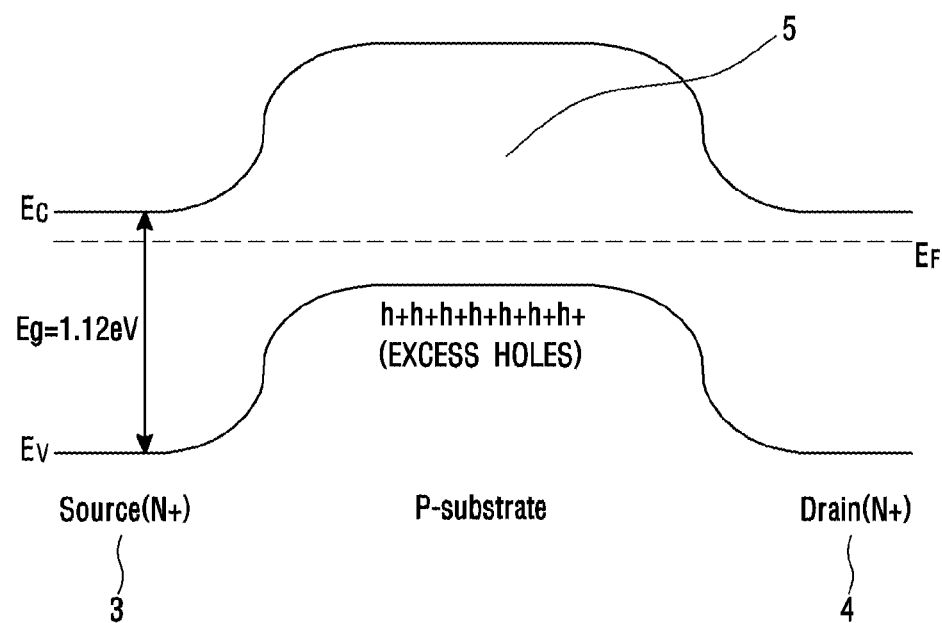
FIG. 1b is an energy band diagram of the conventional capacitorless DRAM.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

A multi-bit capacitorless DRAM according to an embodiment of the present invention includes at least two channel regions. The at least two channel regions may be formed of a nanowire. By using different ion implantation processes or different etching processes, the two or more nanowire channels are formed to have different unique threshold voltages. Since the two or more nanowire channels have different threshold voltages, each of the nanowire channels has its own unique operating voltage which causes impact ionization 9.

Figure 2A:
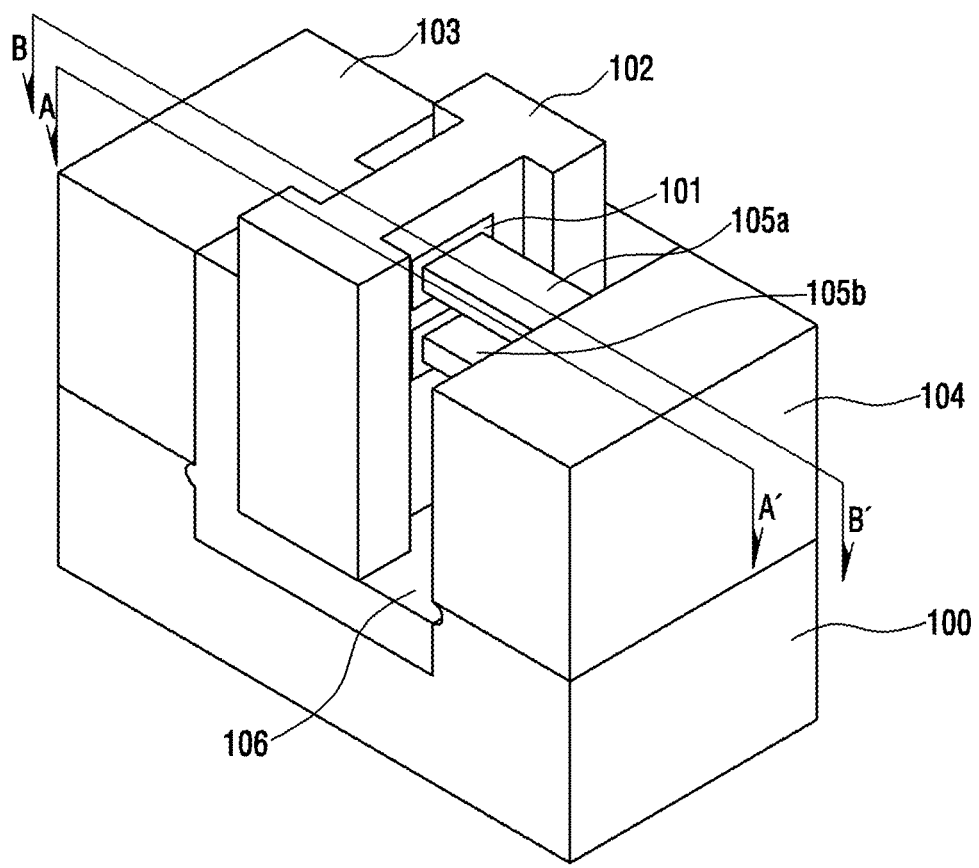
FIG. 2a is a perspective view of a multi-bit capacitorless DRAM according to an embodiment of the present invention.
Figure 2B:
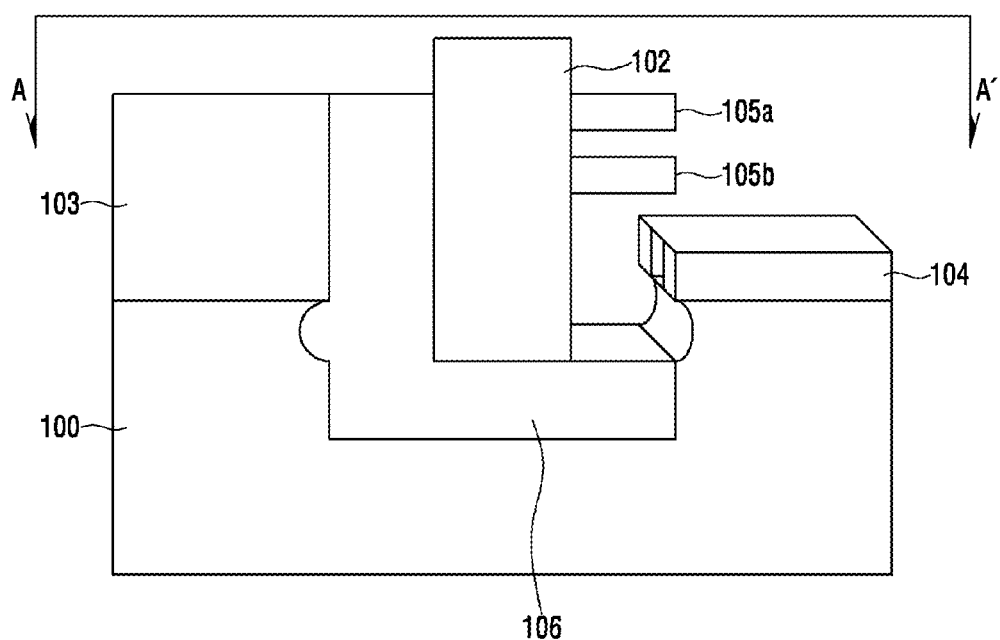

FIG. 2a is a perspective view of the multi-bit capacitorless DRAM according to an embodiment of the present invention. FIG. 2b is a cross sectional view of the multi-bit capacitorless DRAM, taken along line A-A' of FIG. 2a. Particularly, FIG. 2b shows the structure of the capacitorless DRAM in more detail by cutting a portion of a drain 104. As shown in FIGS. 2a and 2b, unlike a conventional capacitorless DRAM, the multi-bit capacitorless DRAM according to the embodiment of the present invention includes a plurality of nanowire channels. While FIGS. 2a and 2b show only two nanowire channels 105a and 105b, this is only for simplification of the description, more than two nanowire channels may be included.

The multi-bit capacitorless DRAM according to the embodiment of the present invention includes a substrate 100, a source 103 and the drain 104 formed on the substrate 100, the plurality of nanowire channels 105a and 105b formed on the substrate 100, a gate insulation layer 101 formed in the plurality of nanowire channels 105a and 105b, and a gate 102 formed on the gate insulation layer 101. Meanwhile, a shallow trench isolation (STI) oxide layer 106 for isolating the respective components may be further included. The shallow trench isolation STI oxide layer 106 is intended to reduce leakage current between the source 103 and the drain 104 or leakage current between different transistors. The shallow trench isolation STI oxide layer 106 may be formed of silicon oxide layer ($SiO_2$) by use of chemical vapor deposition (CVD) or through oxidation.

The substrate 100 may be any one of a bulk wafer, a silicon-on-insulator wafer, a germanium-on-insulator wafer, a strained germanium-on-insulator wafer, a strained silicon-on-insulator wafer, a III-V material (group III and group V elements) made wafer, and a silicon-germanium (SiGe) wafer. However, the substrate 100 is not limited to this.

The gate insulation layer 101 may be a silicon oxide layer or a high-K. More specifically, the gate insulation layer 101 may be made of silicon oxide, a nitride film, aluminum oxide, hafnium oxide, hafnium oxynitride, zinc oxide, lanthanum oxide, hafnium silicon oxide, etc. However, the material of the gate insulation layer 101 is not limited to these materials.

The gate 102 may be made of a metallic material or polysilicon. That is, the gate 102 may be made of one of Al, Mo, Mg, Cr, Pd, Au, Pt, and Ti or any combination of them. Polycrystalline Silicon, polysilicon p-type doped with high density, polymers or organic matters having a high electrical conductivity may be used to form the gate 102. Also, a metal silicide layer such as NiSi or a material similar thereto may be used as the material of the gate 102. However, the material of the gate 102 is not limited to this.

Moreover, the gate 102 may have a planar FET structure, a gate all around (GAA) FET structure, a FinFET structure, a double gate FET structure, a tri-gate FET structure, or an omega gate structure, etc.

Prior to the description of the material, structure and forming method of the plurality of nanowire channels 105a and 105b, an operating principle of the multi-bit capacitorless DRAM according to the embodiment of the present invention will be described with reference to FIG. 3.

Figure 3:
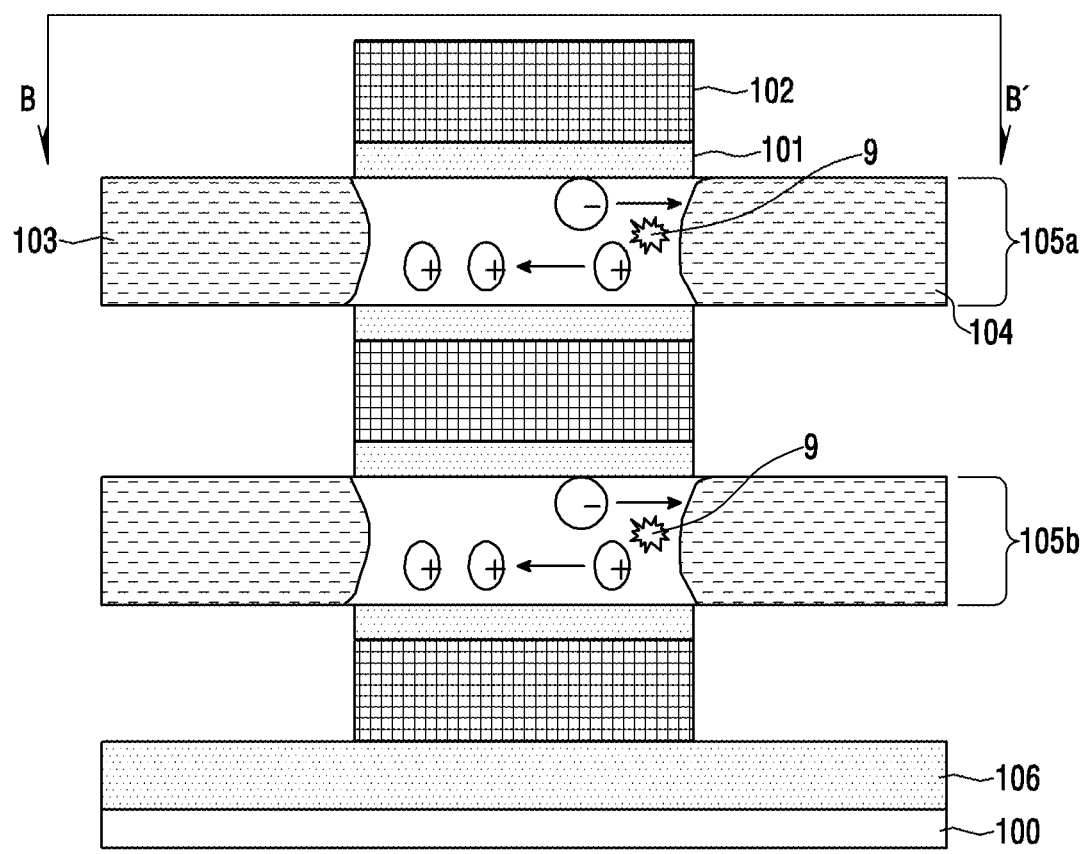
FIG. 3 is a cross sectional view of the multi-bit capacitorless DRAM, taken along line B-B' of FIG. 2a and is a view for describing an impact ionization phenomenon.

FIG. 3 is a cross sectional view of the multi-bit capacitorless DRAM, taken along line B-B' of FIG. 2a and is a view for describing an impact ionization phenomenon.

First, the first upper nanowire channel 105a has its own unique threshold voltage. A driving voltage range may be determined according to the unique threshold voltage of the first nanowire channel 105a. The unique threshold voltage and the driving voltage range are referred to as a first threshold voltage and a first driving voltage range respectively.

When a voltage within the first driving voltage range is applied to the gate 102 and the drain 104 (here, the source 103 may be fixed at 0V), excess holes (indicated by '+' in FIG. 3) are generated in the channel of the drain 104 side by impact ionization 9. Since there is no outlet which allows the generated excess holes to escape, they are accumulated within a body of the first nanowire channel 105a. A threshold voltage and a current level in a case where the excess holes are accumulated are different from those of a case where the body does not have the holes. Here, a state '0' and a state '1' are distinguished by using the differences.

Meanwhile, the second lower nanowire channel 105b also has its own unique threshold voltage. The driving voltage range may be determined according to the unique threshold voltage of the second nanowire channel 105b. The unique threshold voltage and the driving voltage range are referred to as a second threshold voltage and a second driving voltage range respectively.

The first threshold voltage and the second threshold voltage may be different from each other. As a result, the first driving voltage range and the second driving voltage range become different from each other. For the purpose of causing the first threshold voltage and the second threshold voltage to have different values, the following methods can be employed.

(1) In the formation of the plurality of nanowire channels, at least one of the kind, depth, concentration, and angle of a doped ion is changed, so that the nanowire channels can have different threshold voltages.

(2) In the formation of the plurality of nanowire channels, the shape or area of the cross-section of each of the nanowire channels is changed, so that the nanowire channels can have different threshold voltages. Here, in the formation of each of the nanowire channels, at least one of the kind and concentration of an etching material, an etching time period, the degree of a vacuum, and an etching temperature is changed, so that the shape (triangle, circle, rhombus, etc.) or area of the cross-section can be changed.

Also, in the second nanowire channel 105b, when a voltage within the second driving voltage range is applied to the gate 102 and the drain 104 (here, the source 103 may be fixed at 0V), excess holes (indicated by '+' in FIG. 3) are generated in the channel of the drain 104 side by impact ionization 9. Since there is no outlet which allows the generated excess holes to escape, they are accumulated within a body of the second nanowire channel 105b. A threshold voltage and a current level in a case where the excess holes are accumulated are different from those of a case where the body does not have the holes. Here, a state '0' and a state '1' are distinguished by using the differences.

By controlling the unique operating voltage of each of the first and second nanowire channels 105a and 105b, the state '0' and the state '1' can be distinguished in each of the first nanowire channel 105a and the second nanowire channel 105b respectively. Therefore, it becomes possible to store 2 bit of information. Furthermore, when n number of nanowire channels are provided, bit of information can be stored, so that it is possible to achieve the integration of the memory.

Hereinafter, a method for forming the plurality of nanowire channels in the multi-bit capacitorless DRAM according to the embodiment of the present invention will be described with reference to FIGS. 4, 5a to 5e, and 6a to 6c.

Figure 4:
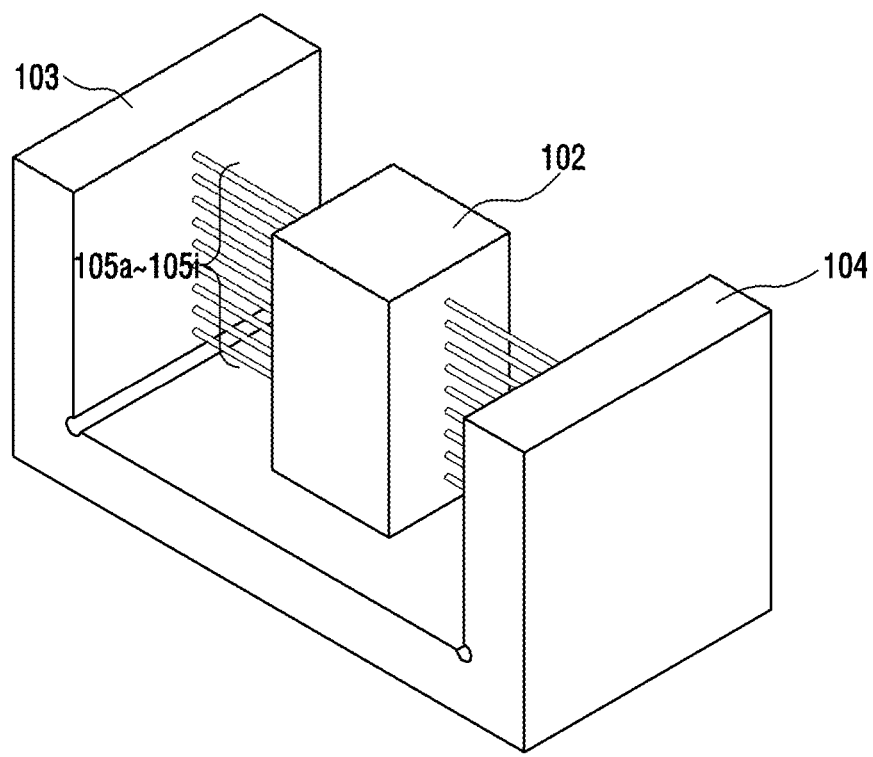
FIG. 4 is a perspective view showing main components of the multi-bit capacitorless DRAM according to the embodiment of the present invention.

FIG. 4 is a perspective view showing main components of the multi-bit capacitorless DRAM according to the embodiment of the present invention. As shown in FIG. 4, the multi-bit capacitorless DRAM according to the embodiment of the present invention may include a plurality of nanowire channels 105a and 105i. Since the source 103, the drain 104, and the gate 102 have been described above, the description thereof will be omitted here. A gate insulation layer (not shown) surrounding the nanowire channels 105a and 105i is not explicitly shown in FIG. 4. After the plurality of nanowire channels 105a and 105i are formed, the gate insulation layer (not shown) may be formed through FIGS. 5a to 5e and FIGS. 6a to 6c.

Figure 5A:
FIGS. 5A, 5B, 5C, 5D, and 5E show steps of forming a plurality of nanowires in the multi-bit capacitorless DRAM according to the embodiment of the present.

First, as shown in FIG. 5a, the substrate 100 is provided. The provided substrate 100 may be a single crystal silicon substrate. The substrate 100 may have an n-type or p-type, depending on the material thereof. As described above, the substrate 100 may be any one of a bulk wafer, a silicon-on-insulator wafer, a germanium-on-insulator wafer, a strained germanium-on-insulator wafer, a strained silicon-on-insulator wafer, a III-V material (group III and group V elements) made wafer, and a silicon-germanium (SiGe) wafer. However, the substrate 100 is not limited to this.

In the embodiment of the present invention, for convenience of understanding, the following description will be provided by assuming that the p-type silicon substrate 100 is used.

Figure 5B:
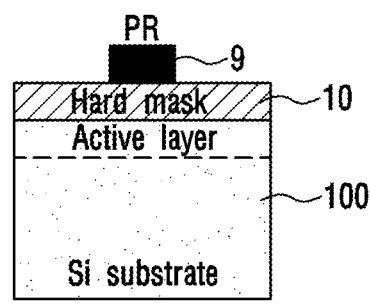

After the substrate 100 is provided, a hard mask 10 is, as shown in FIG. 5b, deposited on the substrate 100. After the hard mask 10 is deposited, a photoresist 9 is patterned.

Figure 5C:
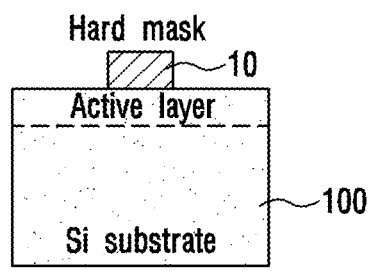
Figure 5D:
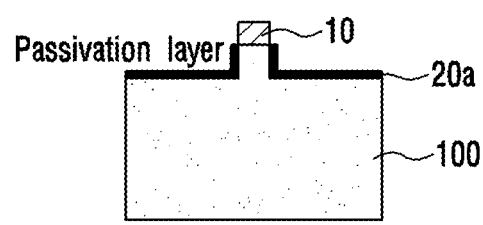

Subsequently, the hard mask 10 is etched by using the photoresist 9 as a passivation layer, and then residual photoresist 9 is removed. FIG. 5c shows the state obtained by performing such a process. In the state where all the photoresist 9 are removed, an area to become the nanowire channel is, as shown in FIG. 5d, formed by anisotropic etching, and then a passivation layer 20a is formed. Here, chlorine gas ($Cl_2$) may be used in the anisotropic etching. The passivation layer 20a may be made of polymer based $C_xF_y$ gases, for example, octafluorocyclobutane ($C_4F_8$) as one of them. However, the gas used in the anisotropic etching and the material used as the passivation layer 20a are not limited to the above-described materials.

Figure 5E:
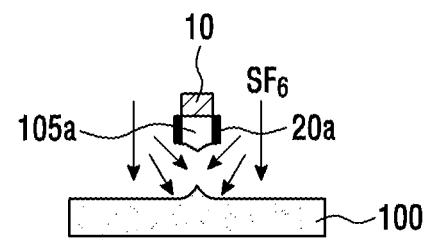

Next, as shown in FIG. 5e, the nanowire channel separated from the substrate 100 is formed by using isotropic etching. The first one nanowire channel 105a is formed through the processes of FIGS. 5a to 5e. Here, sulphur hexafluoride ($SF_6$) may be used in the isotropic etching. However, the gas used in the isotropic etching is not limited to this.

Figure 6A:
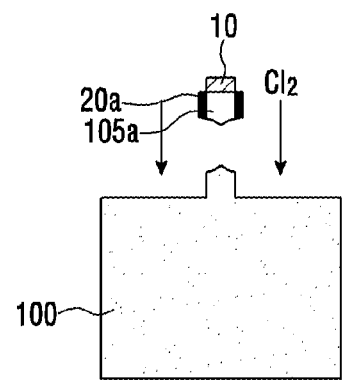
FIGS. 6A, 6B, and 6C show steps of forming the plurality of nanowires in the multi-bit capacitorless DRAM according to the embodiment of the present.
Figure 6B:
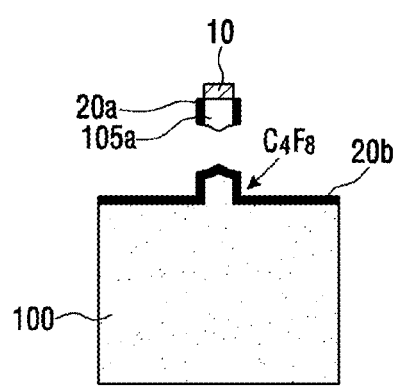
Figure 6C:
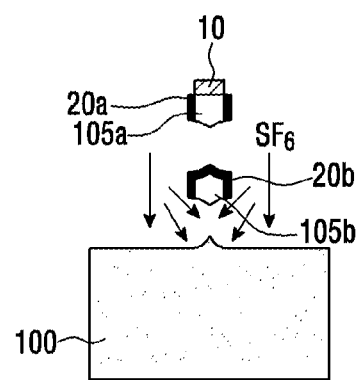

FIGS. 6a to 6c show a process of forming the plurality of nanowire channels by forming another nanowire channel below the nanowire channel 105a formed by the process of FIGS. 5a to 5e.

As shown in FIG. 6a, after the first nanowire channel 105a is formed, the anisotropic etching is performed again. Here, chlorine gas ($Cl_2$) may be used in the anisotropic etching. However, as described above, the gas used in the anisotropic etching is not limited to this.

Then, as shown in FIG. 6b, after a passivation layer 20b is formed by using the polymer based octafluorocyclobutane ($C_4F_8$), the isotropic etching is, as shown in FIG. 6c, performed through use of the sulphur hexafluoride ($SF_6$). As a result, the second nanowire channel 105b is formed below the first nanowire channel 105a and is spaced apart from the first nanowire channel 105a by a predetermined distance. By performing such a process nine times, a total of nine nanowire channels 105a to 105i are formed. However, this is just an example. The plurality of nanowire channels can be formed by various methods.

The process subsequent to the formation of the plurality of nanowire channels 105a and 105i will be described in brief. After the plurality of nanowire channels 105a and 105i are formed, silicon oxide is deposited and a chemical-mechanical polishing (CMP) is performed.

Then, the patterned photoresist is formed so as to remove the area where the plurality of nanowire channels 105a and 105i are located. Then, the silicon oxide of the area exposed by the patterning of the photoresist is etched, so that a trench is formed.

Here, there may be further steps of removing the photoresist and controlling the size of the cross-section of the nanowire channels 105a and 105i by sacrificial oxidation, and of curing damage caused by the etching process. Subsequently, the gate insulation layer is formed on the nanowire channel exposed by the formation of the trench, and a gate layer is formed on the gate insulation layer.

The gate insulation layer 101 may be a silicon oxide layer or a high-K. More specifically, the gate insulation layer 101 may be made of silicon oxide, a nitride film, aluminum oxide, hafnium oxide, hafnium oxynitride, zinc oxide, lanthanum oxide, hafnium silicon oxide, etc. However, the material of the gate insulation layer 130 is not limited to these materials.

Meanwhile, the gate layer may be made of a metallic material or polysilicon. That is, the gate layer may be made of polysilicon and a metallic material such as Al, Mo, Mg, Cr, Pd, Au, Pt, and Ti. However, the present invention is not limited to these materials.

Then, the source and the drain are formed in the areas to be removed of the silicon oxide and the gate layer. Therefore, in consideration of this, the patterning is appropriately performed. The gate insulation layer 101 is located in the area where the plurality of nanowire channels 105a and 105i have been formed. The silicon oxide is formed on both sides of the area where the plurality of nanowire channels 105a and 105i have been formed. The gate layer is deposited on the top surface of the area.

Subsequently, high density n+ type impurity ion (group V elements of the periodic table) or high density p+ type impurity ion (group III elements of the periodic table) is implanted, so that the doped gate 102 is formed and the source 103 and the drain 104 are formed which are spaced apart from the gate 102 by the length of the nanowire channels 105a and 105i.

Here, in lieu of the polysilicon into which high density n-type ion (group V elements of the periodic table) has been implanted, a metallic material may be used as the gate layer. The surface roughness of the nanowire is reduced by hydrogen annealing.

The process subsequent to the formation of the plurality of nanowire channels 105a and 105i may be variously performed by using known semiconductor manufacturing processes and methods without being limited to the above-mentioned method. It goes without saying that a portion of the process subsequent to the formation of the plurality of nanowire channels 105a and 105i is omitted or is replaced by another necessary process. According to circumstances, the order of the process may be changed or a plurality of processes may be simultaneously performed.

Figure 7A:
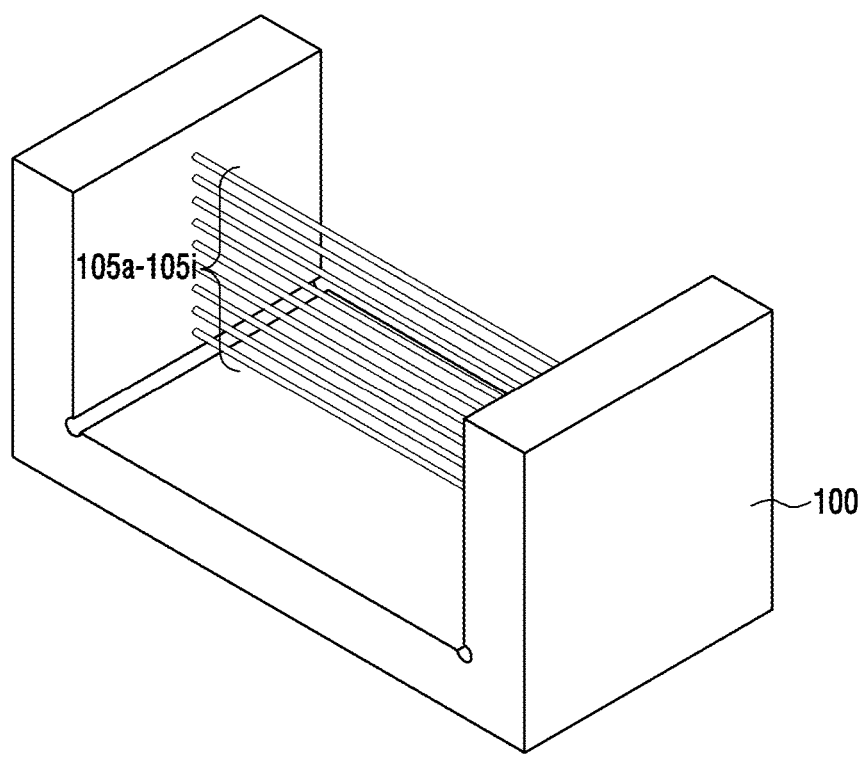
FIGS. 7a and 7b are views highlighting a plurality of formed nanowire channels alone.
Figure 7B:
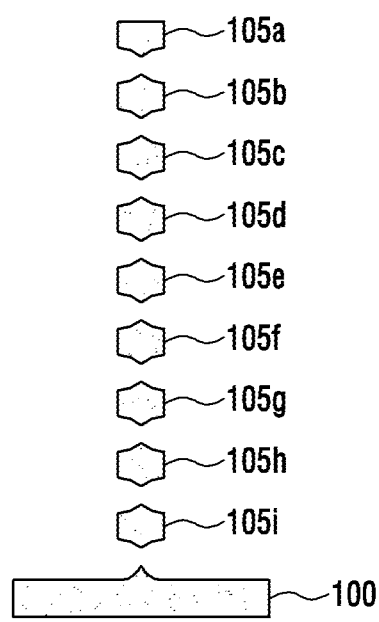

FIGS. 7a and 7b are views showing the plurality of formed nanowire channels 105a and 105i alone. According to the above-described process, the plurality of nanowire channels 105a and 105i may be formed separately from each other by a predetermined distance.

Although FIG. 7b shows that the plurality of nanowire channels 105a and 105i have the same shape and area, the shapes and areas of the nanowire channels can be formed differently by a variety of methods.

For example, in the etching step during the forming process of the plurality of nanowire channels 105a and 105i, the kind and concentration of the etching material, etching time period, the degree of a vacuum, or an etching temperature is changed, so that the nanowire channels 105a and 105i are formed to have different shapes or areas. The nanowire channels 105a and 105i formed by the above-described method are shown in FIGS. 8a and 8b.

Figure 8A:
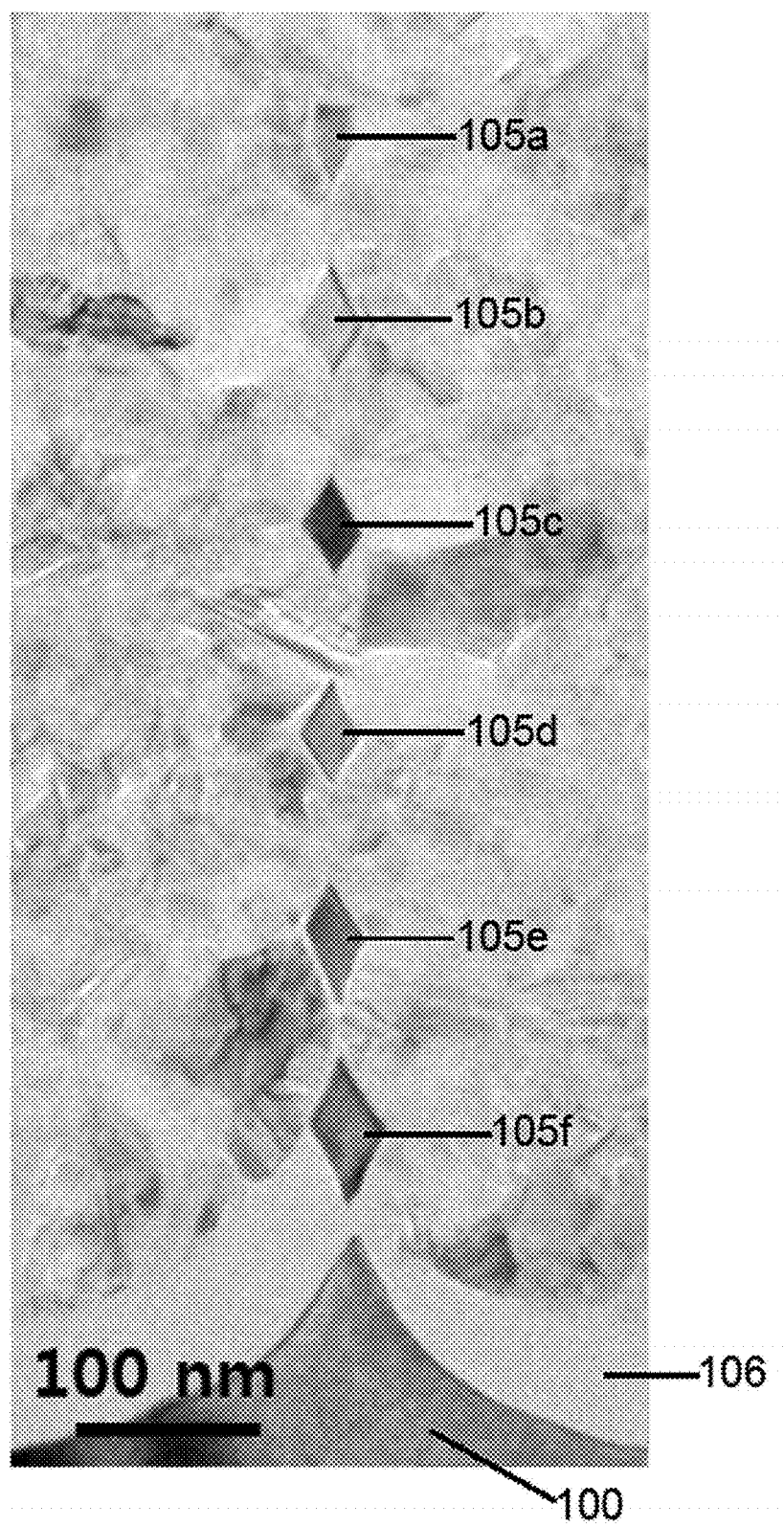
FIGS. 8a and 8b are transmission electron microscope photographs of the nanowire channels having different shapes or areas in the multi-bit capacitorless DRAM according to the embodiment of the present.
Figure 8B:
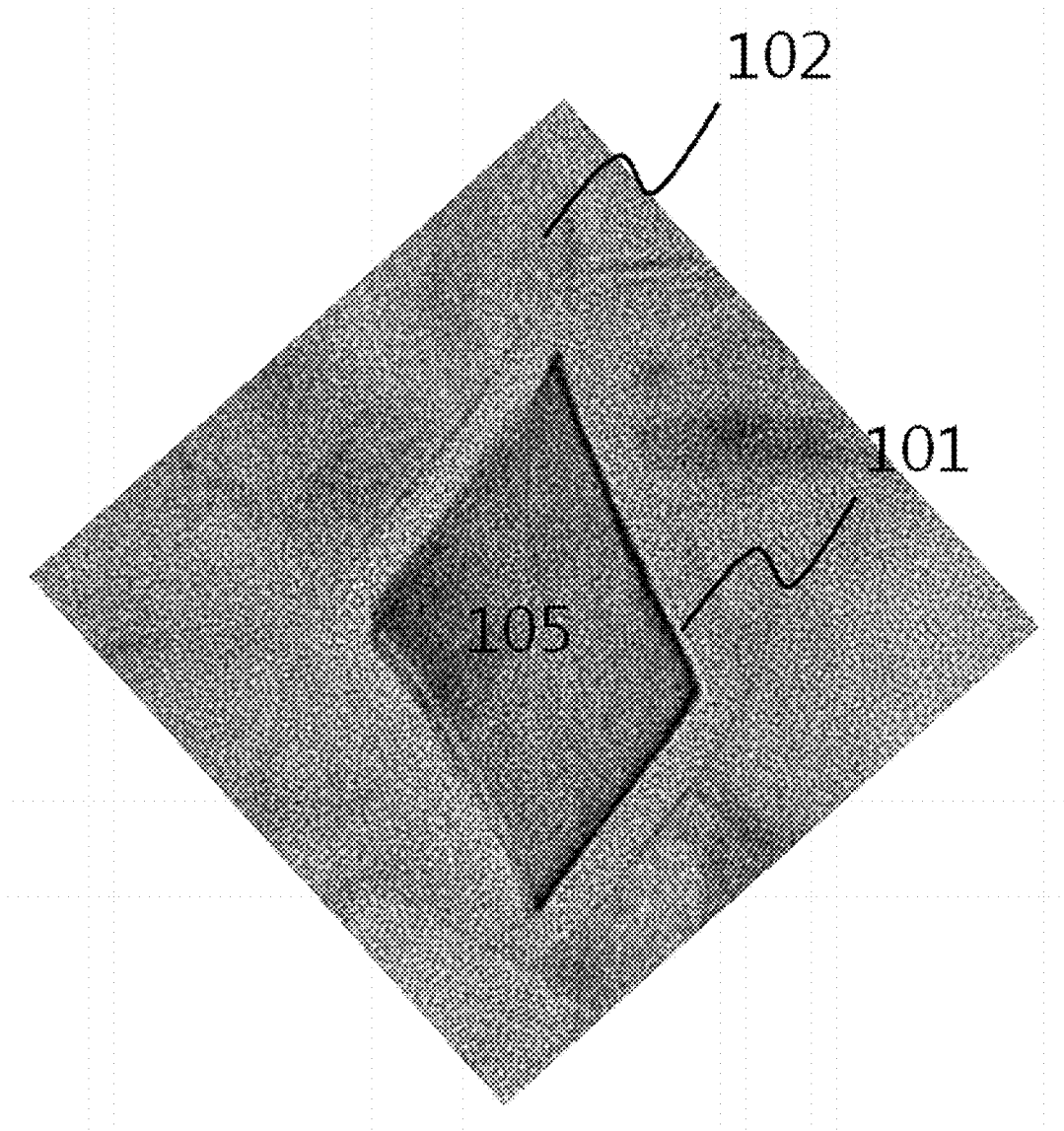

FIGS. 8a and 8b are transmission electron microscope photographs of the nanowire channels 105a and 105f having different shapes or areas in the multi-bit capacitorless DRAM according to the embodiment of the present. A total of six nanowire channels 105a and 105f are shown. As shown in FIG. 8a, the shapes or areas of the nanowire channels 105a and 105f are different from each other, respectively. For example, the first nanowire channel 105a has a shape different from those of the nanowire channels 105b to 105f. Additionally, the area of each of the nanowire channels 105a to 105f increases toward the bottom. Therefore, the nanowire channels 105a and 105f have different threshold voltages and operate in different driving voltage ranges. Here, the driving voltage means a gate voltage (VG READ) which is used for a drain voltage and Read that cause the impact ionization 9.

FIGS. 8a and 8b show the nanowire channels having different shapes or areas. However, another embodiment allows the nanowire channels to have different threshold voltages in a manner different from that of FIGS. 8a and 8b. FIG. 8b also shows the gate insulation layer 101 formed on the nanowire channel 105a.

For example, in the formation of the nanowire channel, at least one of the kind, depth, concentration, and angle of an ion doped in each nanowire channel is changed, so that the nanowire channels can have different threshold voltages respectively.

Figure 9A:
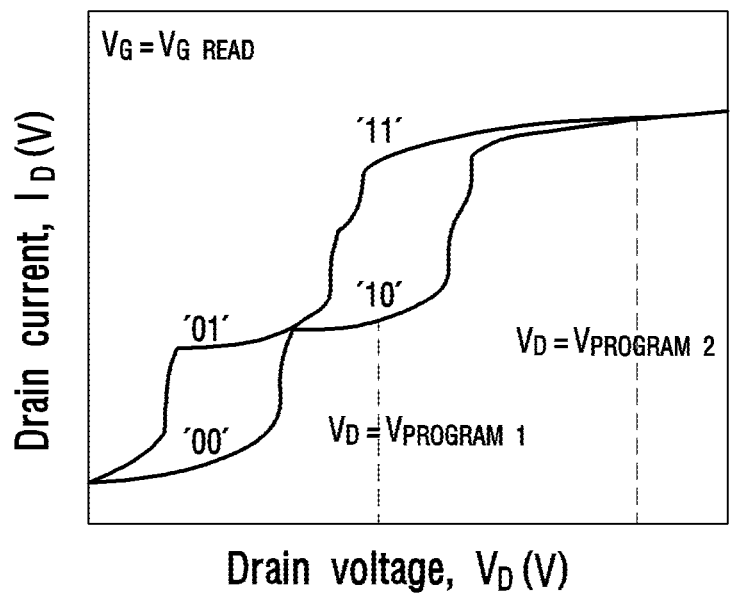
FIGS. 9a and 9b are graphs showing an operating voltage range of the multi-bit capacitorless DRAM according to the embodiment of the present.
Figure 9B:
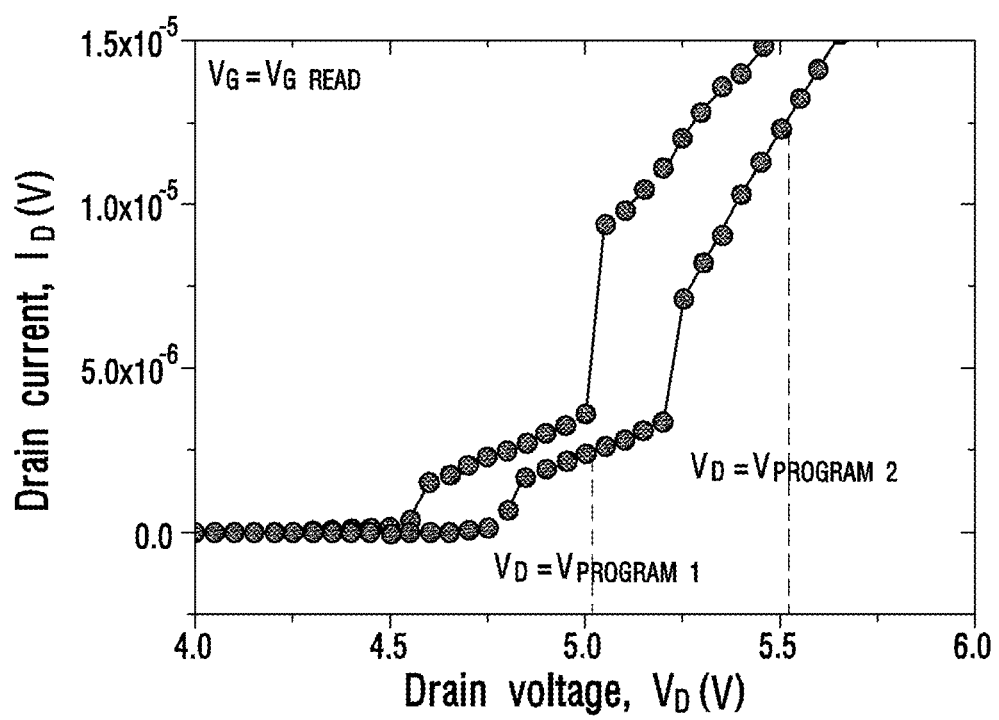

FIGS. 9a and 9b are graphs showing an operating voltage range of the multi-bit capacitorless DRAM according to the embodiment of the present. Four areas of a state '00', a state '01', a state '10', and a state '11' can be used as a memory by assuming two nanowire channels.

In FIGS. 9a and 9b, when a current magnitude difference between the state '00' and the state '01' is used as the memory, this is referred to as a first operating area, and when a current magnitude difference between the state '10' and the state '11' is used as the memory, this is referred to as a second operating area.

As shown in FIG. 9a, in order that a DRAM in an initial state is programmed in the state '11', a drain voltage $V_D$ of $V_{PROGRAM2}$ which is an operating area corresponding to the programming is used. In order that the DRAM in the initial state is programmed in the state '01', a drain voltage $V_D$ of $V_{PROGRAM1}$ is used. As a result, it is two bits that can be used in the multi-bit capacitorless DRAM according to the embodiment of the present invention. Through the expansion of this, when a larger number of the nanowire channels are provided, the nanowire channels function as a memory capable of storing a larger number of bits. FIG. 9b shows actually measured data representing a drain voltage range measured from an actually manufactured device. The drain voltage $V_D$ for causing the DRAM in the initial state to be programmed in the state '11' is approximately 5.5 V, and the drain voltage $V_D$ for causing the DRAM in the initial state to be programmed in the state '01' is approximately 5 V. However, the drain voltage $V_D$ is not limited to this. It is apparent to those skilled in the art that the drain voltage $V_D$ has different values depending on other factors such as the length and width of the nanowire channel, the thickness of the insulation layer, etc.

The multi-bit capacitorless DRAM according to the embodiment of the present invention may further include a controller (not shown) which controls the operation of the DRAM and a storage unit (not shown) which stores the driving voltage for each of the plurality of nanowire channels. Here, the fact that the driving voltage for each of the nanowire channels is based on the unique threshold voltage of each channel is the same as that described above.

Through the method described with reference to FIGS. 9a and 9b, the controller (not shown) controls the driving voltage which is applied to the gate 102 and the drain 104, and then programs or erases 2-bit data. If a larger number of nanowire channels were provided, two or more bit data could be programmed or erased.

Figure 10A:
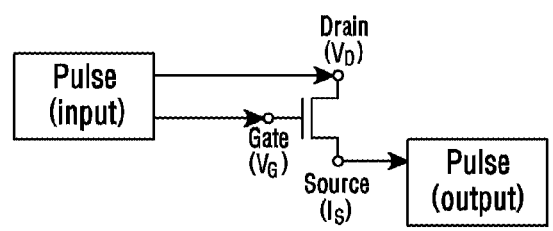
FIG. 10a is a block diagram showing a configuration of an equipment for measuring the operation of the multi-bit capacitorless DRAM according to the embodiment of the present invention.
Figure 10B:
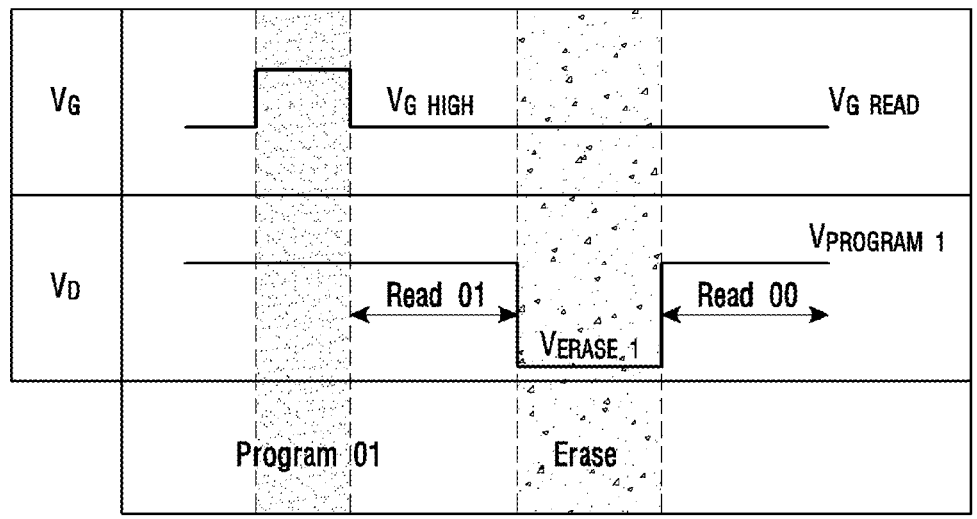
FIGS. 10b and 10c are views showing an input operating voltage in the form of a pulse in each operating area.
Figure 10C:
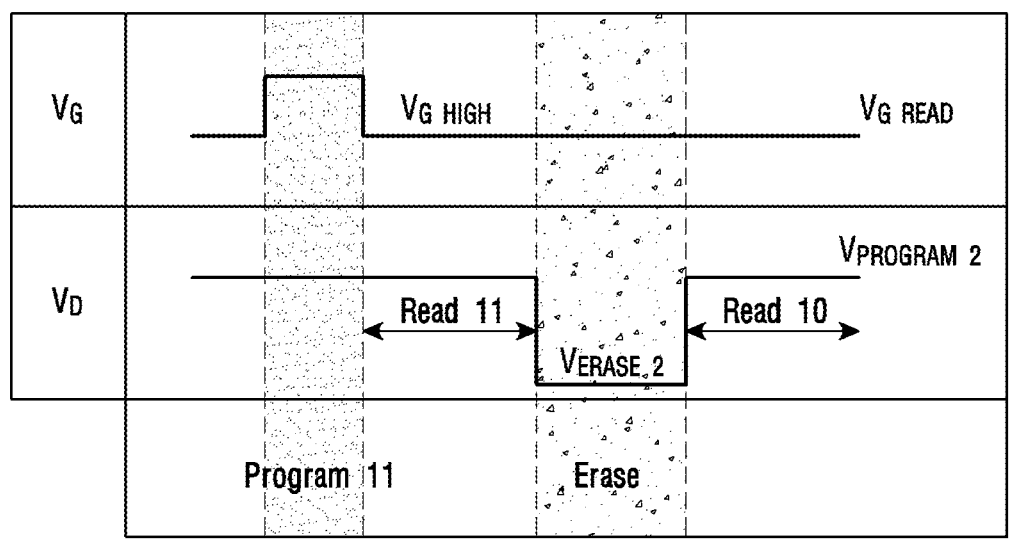

FIG. 10a is a block diagram showing a configuration of equipment for measuring the operation of the multi-bit capacitorless DRAM according to the embodiment of the present invention. FIGS. 10b and 10c are views showing an input operating voltage in the form of a pulse in each operating area (the first operating area and the second operating area).

The impact ionization is caused in each nanowire channel by the pulse-type operating voltage input to the gate 102 and the drain 104. Accordingly, an output current (source current Is) increases.

A state where the output current Is is relatively high is a program state, and a state where the output current Is is relatively low is an erase state.

The pulse-type operating voltage which is input to the first operating area is shown in FIG. 10b. In order that the multi-bit capacitorless DRAM according to the embodiment of the present invention is programmed in the state '01', the drain voltage $V_D$ of $V_{PROGRAM1}$ of FIG. 9a is applied to the drain 104. The capacitorless DRAM programmed in the state '01' by the drain voltage $V_D$ of $V_{PROGRAM1}$ becomes the state '00' again by the erase voltage of $V_{ERASE1}$.

Meanwhile, the pulse-type operating voltage which is input to the second operating area is shown in FIG. 10c. In order that the multi-bit capacitorless DRAM according to the embodiment of the present invention is programmed in the state '11', the drain voltage $V_D$ of $V_{PROGRAM2}$ of FIG. 9a is applied to the drain 104. The capacitorless DRAM programmed in the state '11' by the drain voltage $V_D$ of $V_{PROGRAM2}$ is erased in the state '10' by the erase voltage of $V_{ERASE2}$.

Figure 11A:
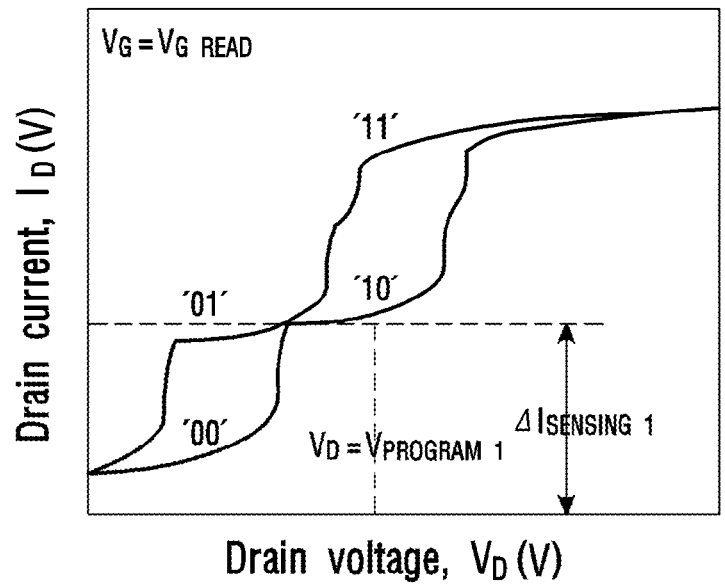
FIG. 11a is a graph showing a current value of a first operating area, which is output by the pulse-type operating voltage shown in FIG. 10b.

FIG. 11a is a graph showing a current value of the first operating area, which is output by the pulse-type operating voltage shown in FIG. 10b. That is, when the drain voltage $V_D$ of $V_{PROGRAM1}$ is input to the drain 104, the impact ionization 9 is caused in the nanowire channel which corresponds to the drain voltage $V_D$ of $V_{PROGRAM1}$. As a result, the source current Is, i.e., the output current, corresponds to a drain current $I_D$ in the first operating area ($\Delta I_{SENSING1}$).

Figure 11B:
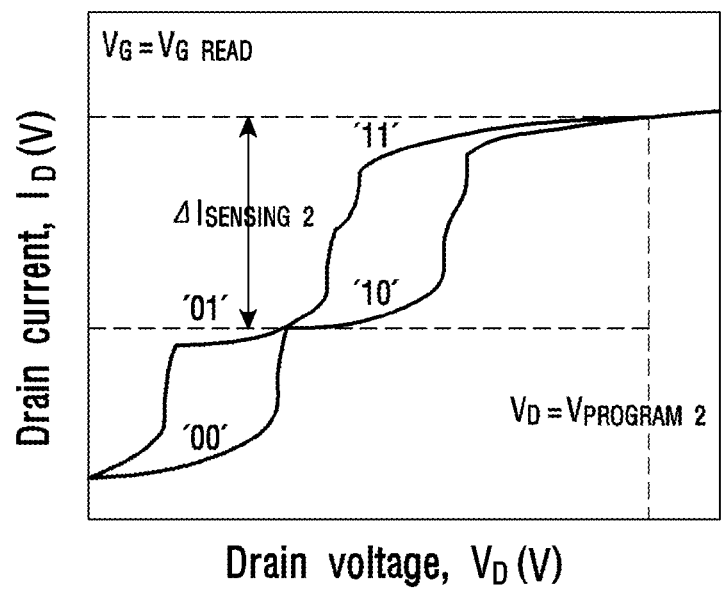
FIG. 11b is a graph showing a current value of a second operating area, which is output by the pulse-type operating voltage shown in FIG. 10c.

FIG. 11b is a graph showing a current value of the second operating area, which is output by the pulse-type operating voltage shown in FIG. 10c. That is, when the drain voltage $V_D$ of $V_{PROGRAM2}$ is input to the drain 104, the impact ionization 9 is caused in the nanowire channel which corresponds to the drain voltage $V_D$ of $V_{PROGRAM2}$. As a result, the source current Is, i.e., the output current, corresponds to the drain current $I_D$ in the second operating area ($\Delta I_{SENSING2}$).

As described above, according to the multi-bit capacitorless DRAM and a manufacturing method thereof in accordance with the embodiment of the present invention, unlike a conventional memory capable of storing (processing) only a single bit, the multi-bit capacitorless DRAM is able to operate at two or more multi-bits, thereby improving the performance and ensuring high integration.

Figure 12:
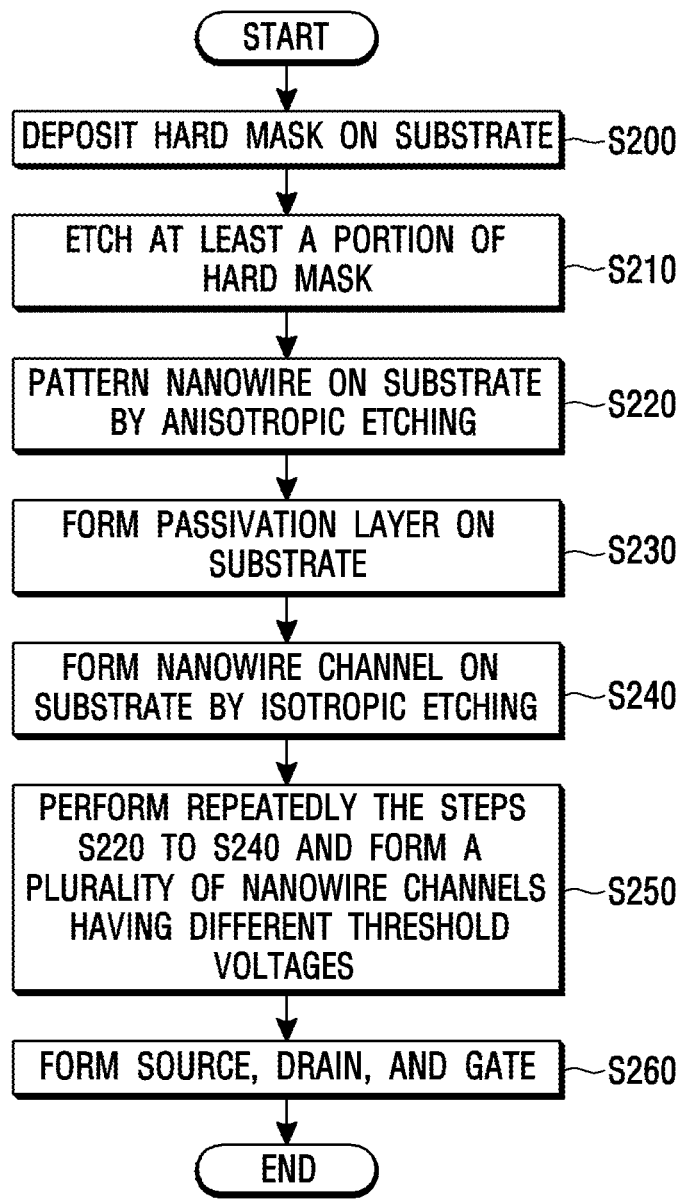
FIG. 12 is a flowchart showing a method for manufacturing the multi-bit capacitorless DRAM according to the embodiment of the present invention.

Meanwhile, FIG. 12 is a flowchart showing a method for manufacturing the multi-bit capacitorless DRAM according to the embodiment of the present invention.

First, the hard mask is deposited on the substrate (S200). Then, at least a portion of the hard mask is etched (S210). Prior to the etching of the hard mask, the photoresist may be patterned.

Subsequently, an area to become the nanowire channel is formed by the anisotropic etching, and then the passivation layer is formed (S220 and S230).

Here, chlorine gas ($Cl_2$) may be used in the anisotropic etching. The passivation layer may be made of polymer based $C_xF_y$ gases, for example, octafluorocyclobutane ($C_4F_8$) as one of them. However, the gas used in the anisotropic etching or the material used as the passivation layer is not limited to what are mentioned above.

In the next step, the nanowire channel separated from the substrate is formed by using the isotropic etching (S240). As such, the nanowire patterning by the anisotropic etching (S220), the formation of the passivation layer (S230), and the formation of the nanowire channel by using the isotropic etching (S240) are repeatedly performed, so that the plurality of nanowire channels are formed (S250).

Here, the plurality of formed nanowire channels may have different threshold voltages respectively.

In the embodiment, every time when each nanowire channel is formed, dopant is implanted with the change of at least one of the kind, depth, concentration, and implantation angle of a doped ion, so that the nanowire channels can have different threshold voltages. In another embodiment, every time when each nanowire channel is formed, at least one of the kind and concentration of the etching material, etching time period, the degree of a vacuum, and an etching temperature is changed, so that the nanowire channels can have different threshold voltages.

By using a band offset on the multi-bit capacitorless DRAM according to the embodiment of the present invention, more improved performance can be obtained. Hereinafter, it will be described that the multi-bit capacitorless DRAM using a band offset in order to improve the performance.

Figure 13B:
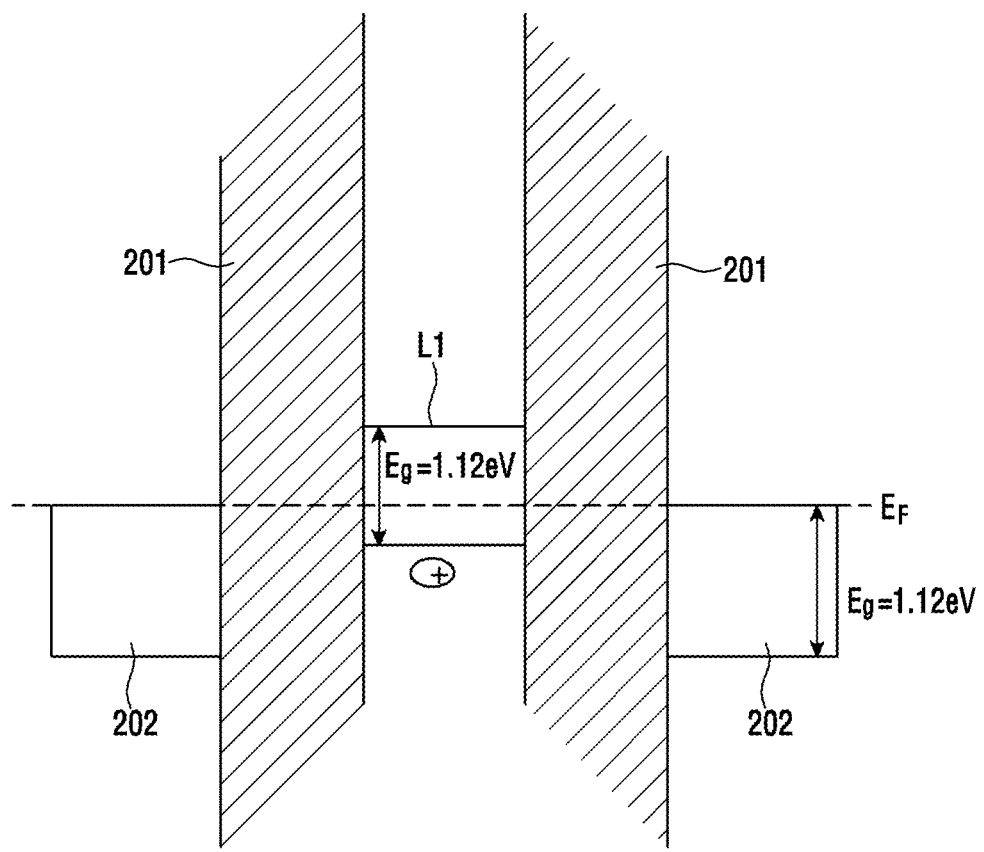

FIG. 13a is a cross sectional view of the above-described multi-bit capacitorless DRAM. FIG. 13b is an energy band diagram of the multi-bit capacitorless DRAM having the structure shown in FIG. 13a.

In the drawings subsequent to FIG. 13a, similar reference numerals are used for the same components as those of FIGS. 2a to 12. However, for the purpose of distinguishing between the components of FIGS. 2a to 12 and the components of the drawings subsequent to FIG. 13a, reference numerals of 200's are used. For example, the gate 102 of FIG. 3 is represented by a gate 202 in FIG. 13a.

In FIG. 13a, since the plurality of nanowire channels are comprised of only a silicon layer L1, the energy band diagram of each of the nanowire channels is the same as shown in FIG. 13b.

Figure 14A:
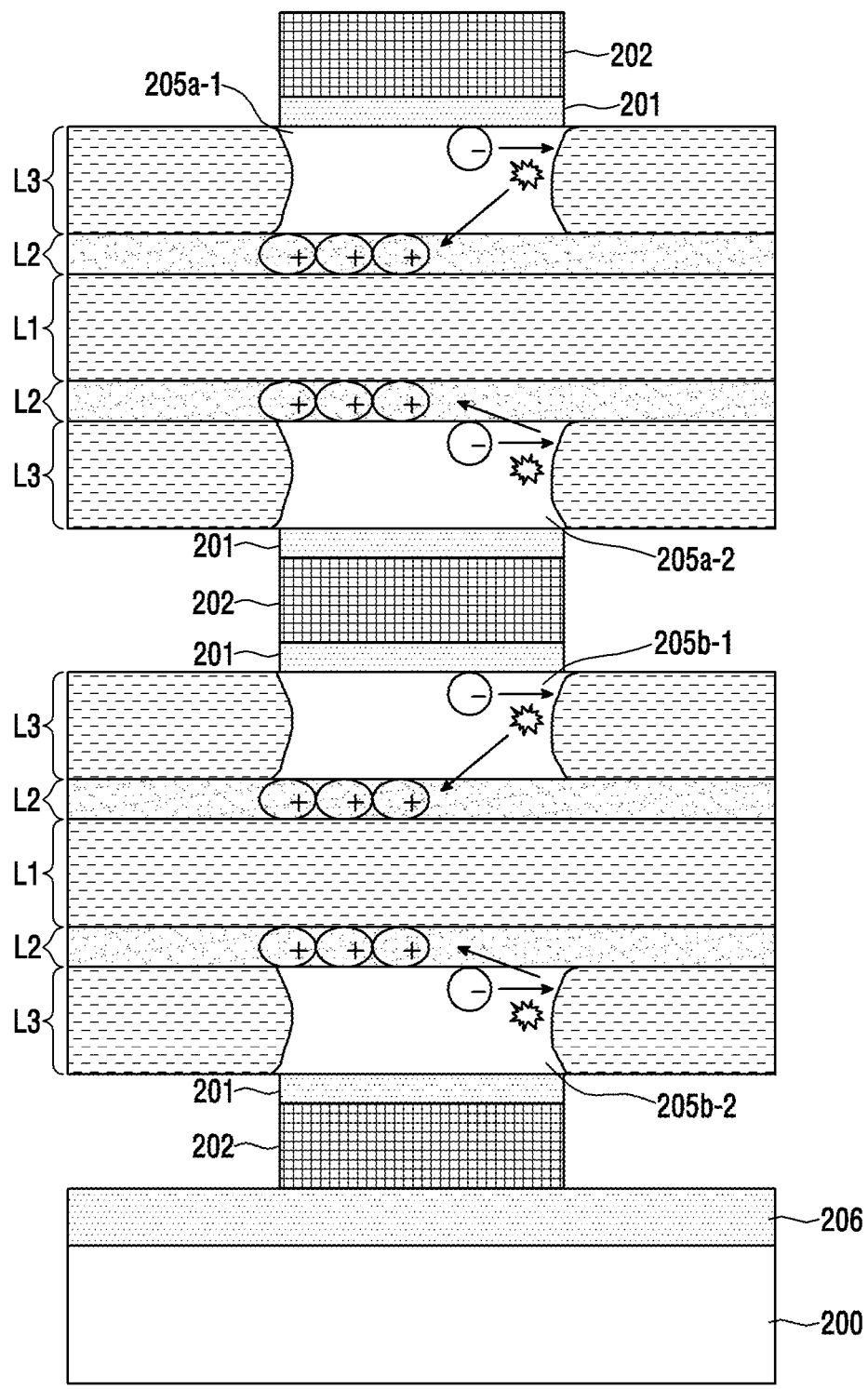
FIGS. 14A, 14B, and 14C are views for describing the multi-bit capacitorless DRAM according to a first embodiment of the present invention.
Figure 14B:
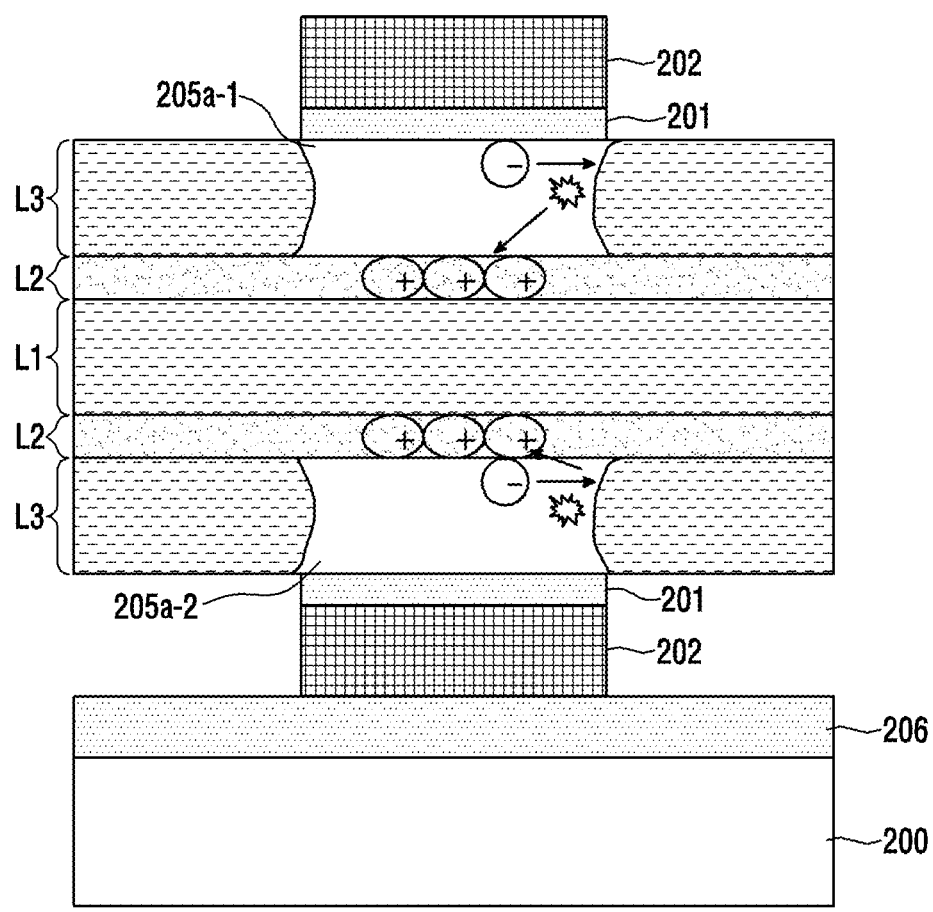
Figure 14C:
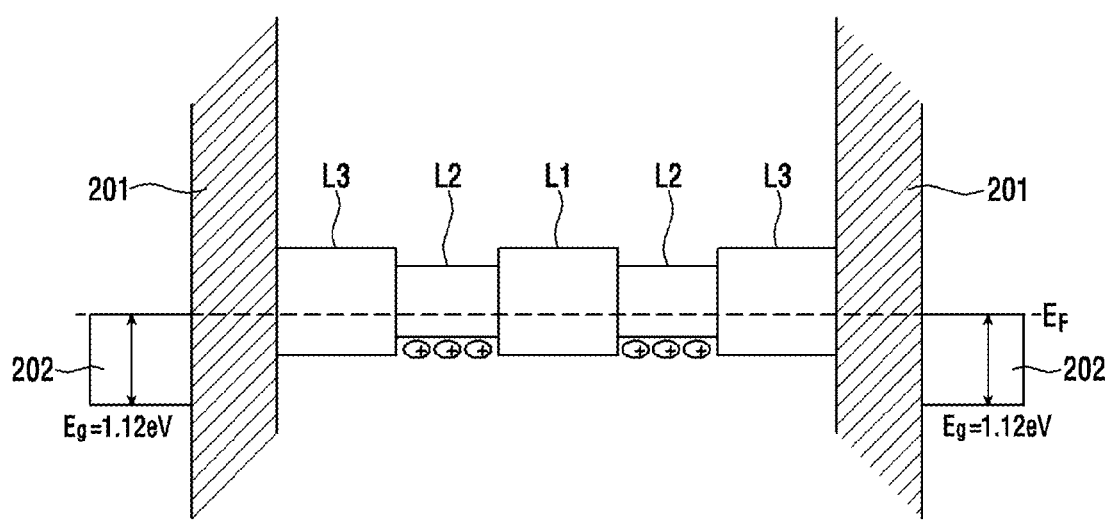
Figure 15A:
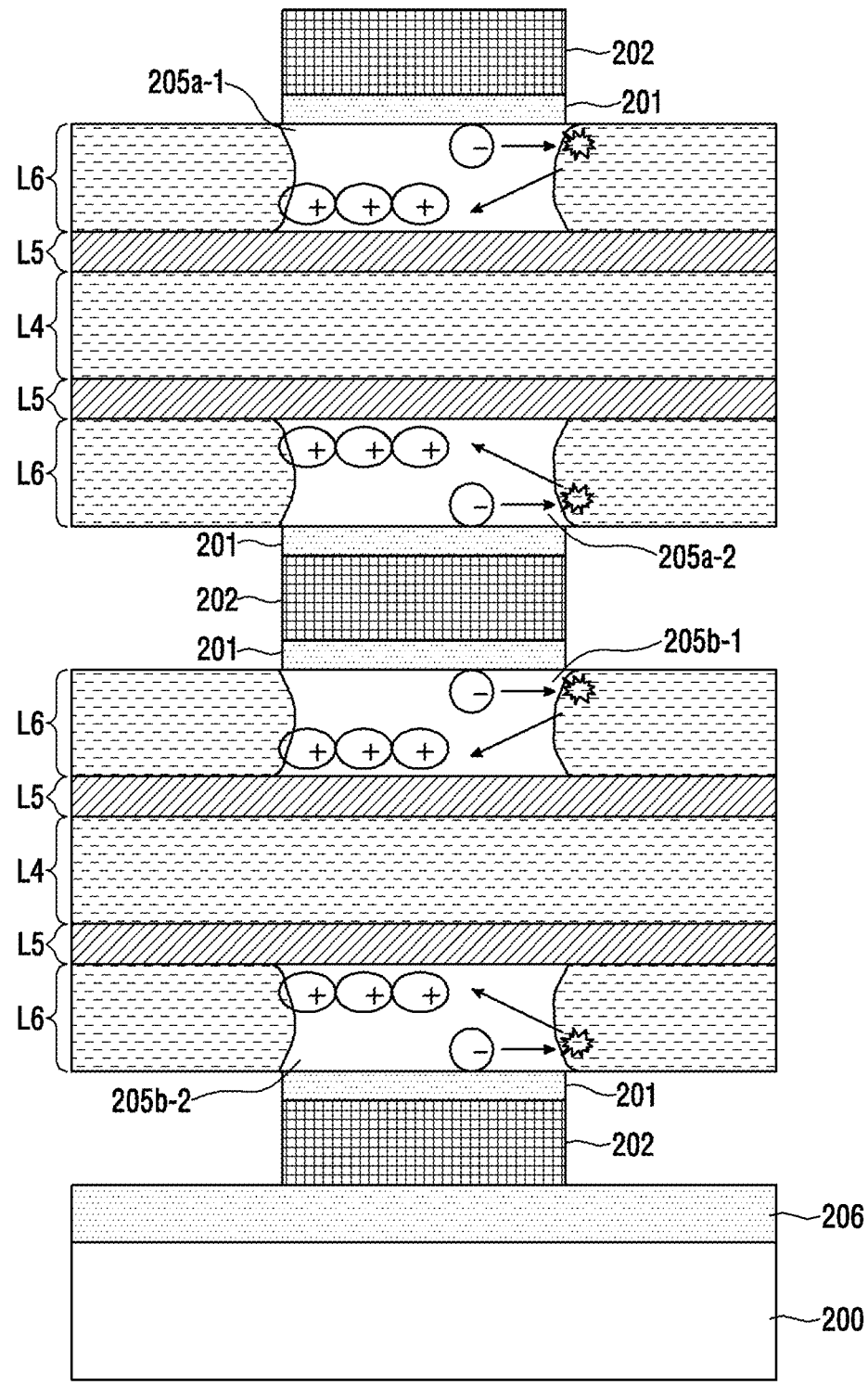
FIGS. 15A, 15B, and 15C are views for describing a multi-bit capacitorless DRAM according to a second embodiment of the present invention.
Figure 15B:
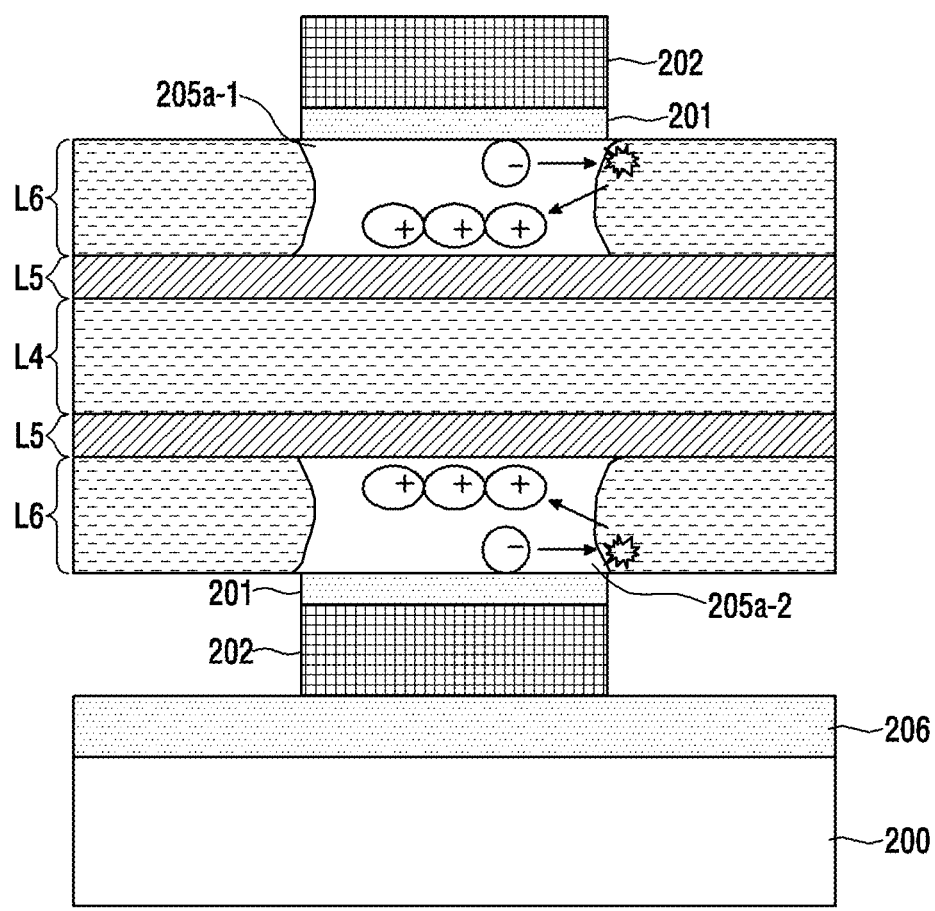
Figure 15C:
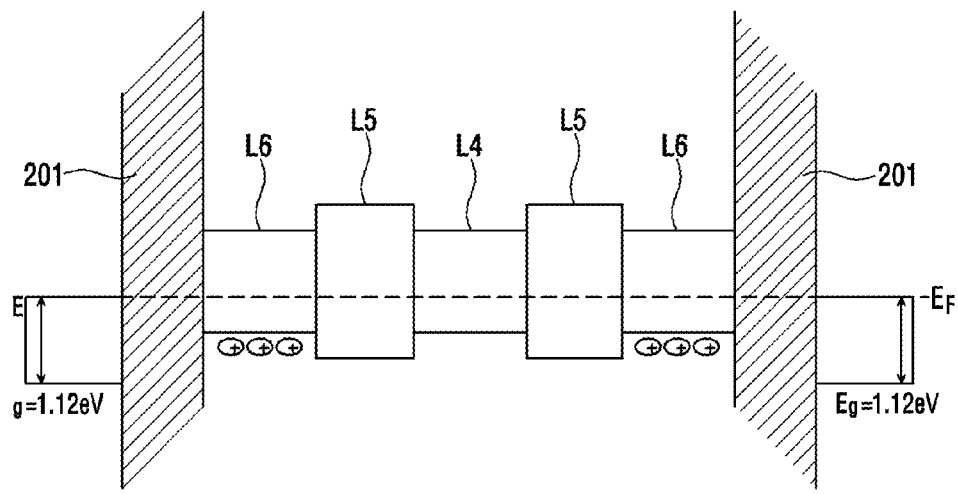
Figure 16A:
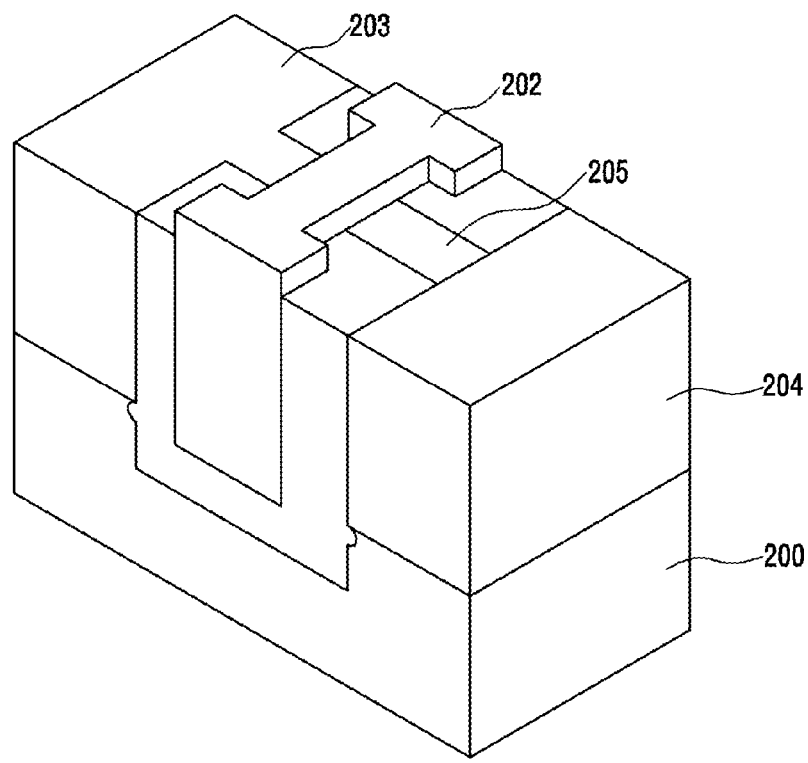
FIGS. 16A, 16B, and 16C are perspective views and a cross sectional view of the multi-bit capacitorless DRAMs according to the first and second embodiments of the present invention.
Figure 16B:
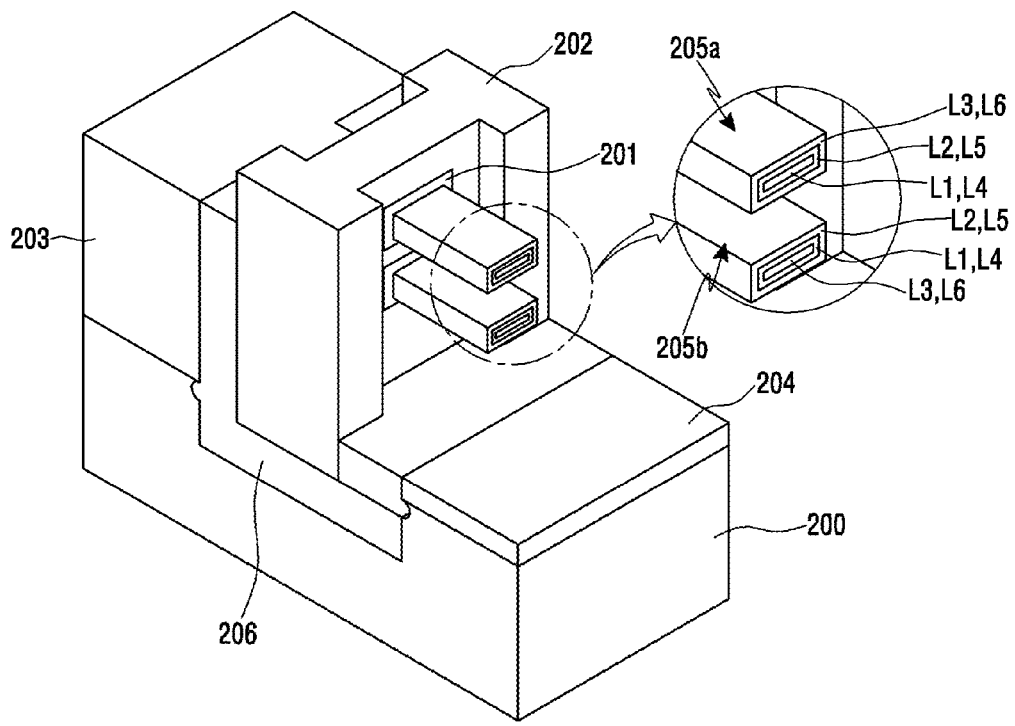
Figure 16C:
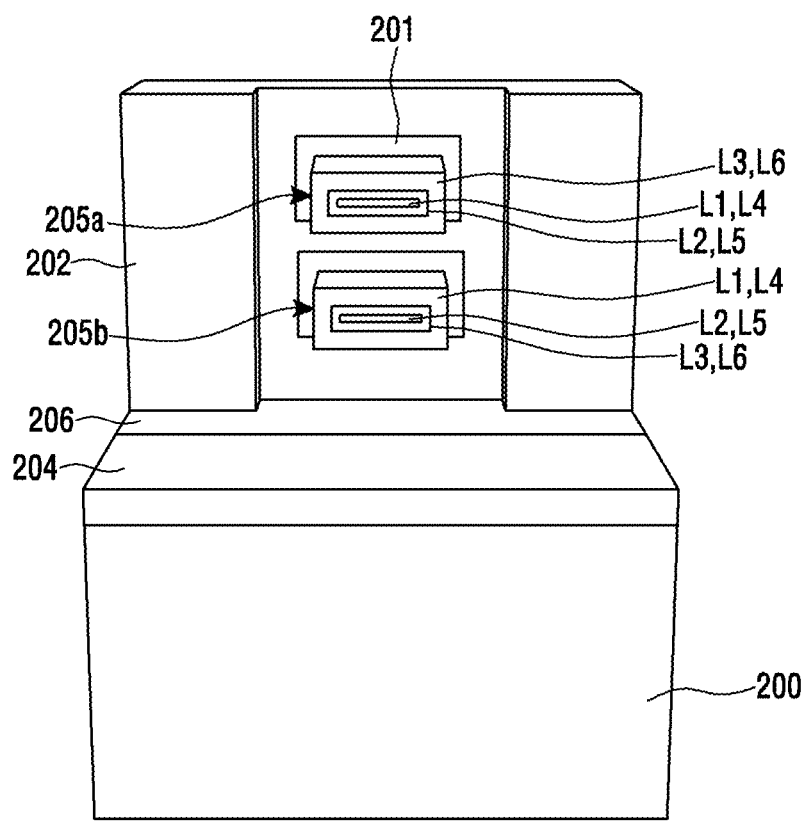
Figure 17A:
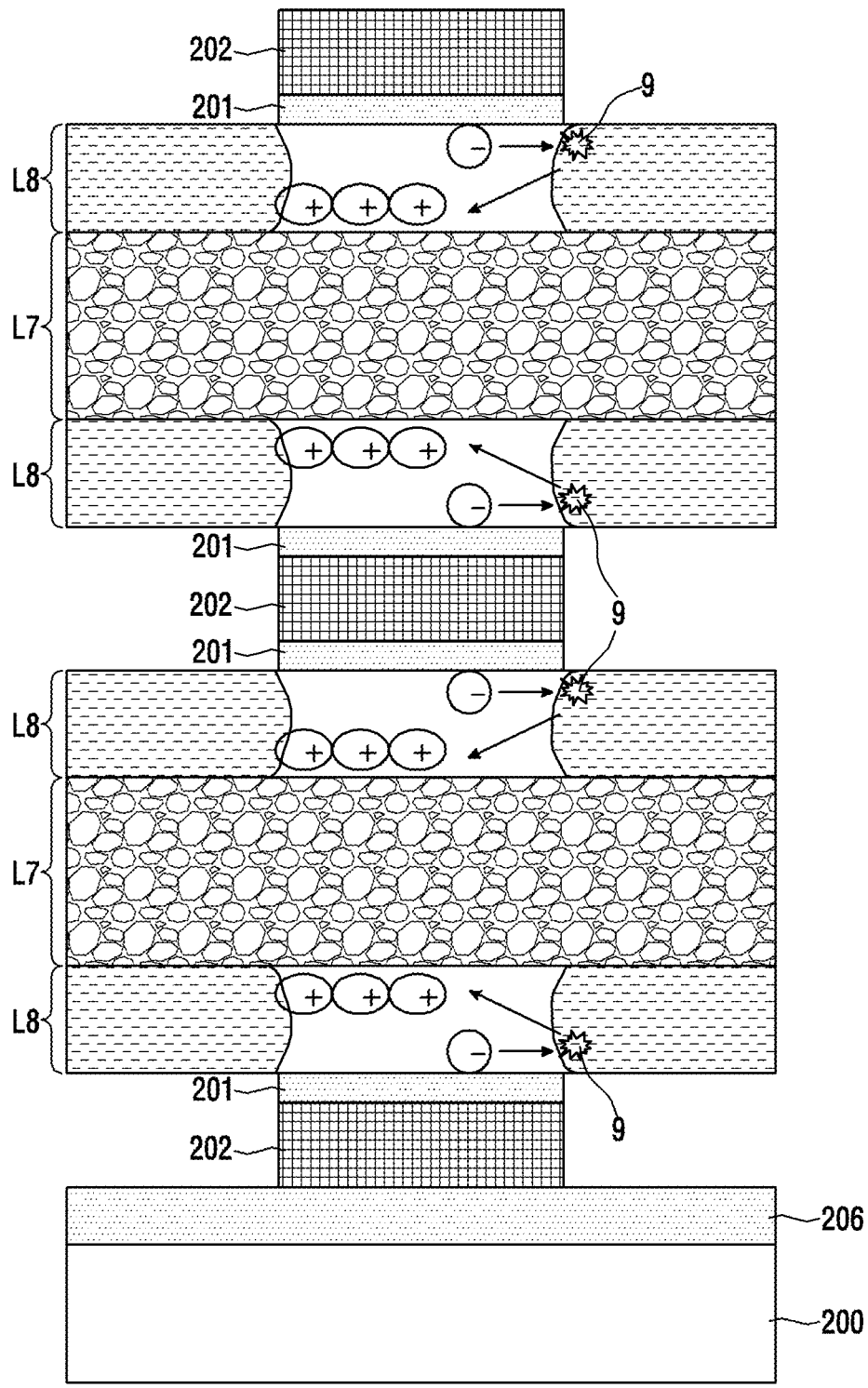
FIGS. 17A, 17B, and 17C are views for describing a multi-bit capacitorless DRAM according to a third embodiment of the present invention.
Figure 17B:
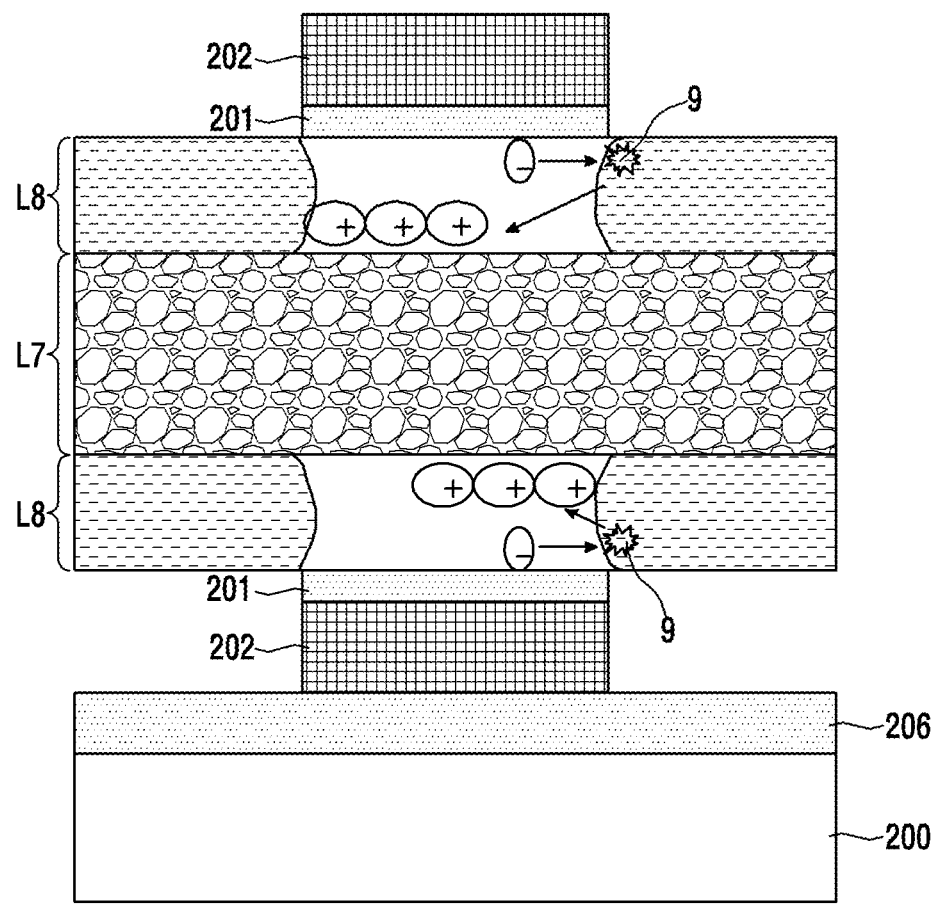
Figure 17C:
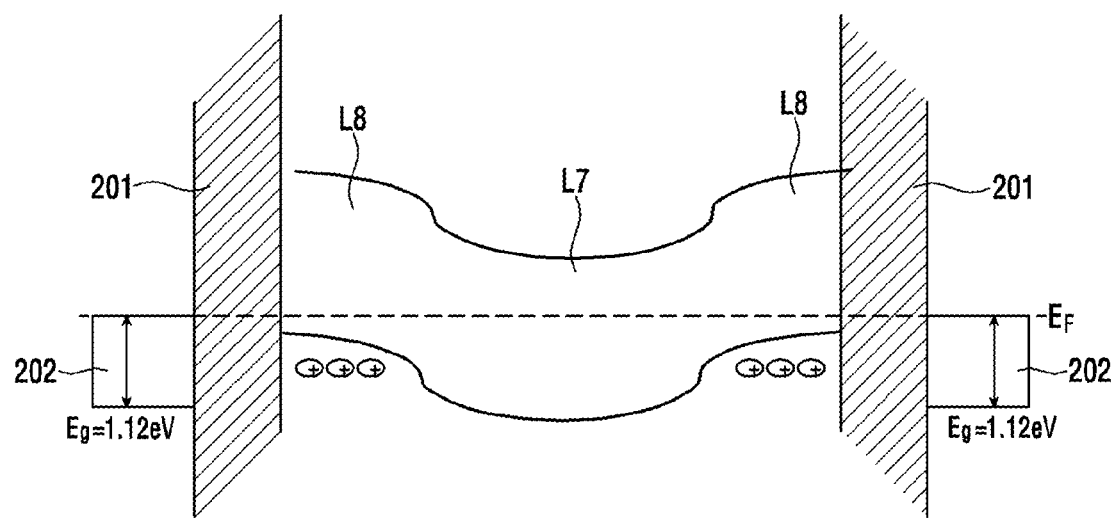

FIGS. 14a to 14c show the multi-bit capacitorless DRAM according to a first embodiment, which has a more improved performance of accumulating the excess holes by using energy band gap. Also, FIGS. 15a to 15c show a multi-bit capacitorless DRAM according to a second embodiment of the present invention. FIGS. 17a to 17c show a multi-bit capacitorless DRAM according to a third embodiment of the present invention. Meanwhile, FIGS. 16a to 16c are perspective views and a cross sectional view of the multi-bit capacitorless DRAMs according to the first and second embodiments of the present invention.

First, FIG. 14a shows a structure in which the performance of accumulating the excess holes is improved by using $Si_{1-x}Ge_x$ grown by epitaxy. FIG. 14b shows separately only one nanowire channel of the structure of FIG. 14a. The energy band diagram of FIG. 14b is shown in FIG. 14c.

In the multi-bit capacitorless DRAM having the structure of FIG. 14a, each of the plurality of nanowire channels includes the silicon layer L1, a first epitaxial layer L2 grown by epitaxy, and a second epitaxial layer L3 grown by epitaxy.

Here, the first epitaxial layer L2 is a $Si_{1-x}Ge_x$ layer grown by epitaxy, and the second epitaxial layer L3 is a silicon layer grown by epitaxy.

More specifically, as shown in FIGS. 16a to 16c, the first epitaxial layer L2 is deposited in the form of surrounding the silicon layer L1. The second epitaxial layer L3 is deposited in the form of surrounding the first epitaxial layer L2.

In $Si_{1-x}Ge_x$, with the increase of the mixing ratio (x) of germanium, the energy level of valence gap increases and the energy level of a conduction band decreases, so that a band gap $E_g$ becomes narrower. The multi-bit capacitorless DRAM according to the embodiment of FIG. 14a makes use of this energy level characteristics.

That is, the epitaxial layer ($Si_{1-x}Ge_x$) grown by epitaxy is provided between the silicon layer L1 and the second epitaxial layer L3 grown by epitaxy. More improved performance can be obtained by using the epitaxial layer ($Si_{1-x}Ge_x$) as quantum well.

As compared with a case where the quantum well is not included (FIG. 13a), the quantum well formed by the first epitaxial layer L2 using $Si_{1-x}Ge_x$ has advantages in that an energy band diagram is much deeper and the change range of the energy level is greater. Therefore, the excess holes generated by the impact ionization 9 can be more effectively accumulated in the quantum well.

Furthermore, as compared with a case where the multi-bit capacitorless DRAM does not include the first epitaxial layer L2 using $Si_{1-x}Ge_x$ (FIG. 13), the multi-bit capacitorless DRAM including the first epitaxial layer L2 using $Si_{1-x}Ge_x$ is able to maintain the accumulation of the excess holes for a longer period of time, so that the sensing window, retention time, and endurance, etc., i.e., the main characteristics of the memory can be enhanced.

FIG. 15a shows a structure in which the performance of accumulating the excess holes is improved by using $Si_{1-x}C_x$ grown by epitaxy. FIG. 15b shows separately only one nanowire channel of the structure of FIG. 14a. The energy band diagram of FIG. 15b is shown in FIG. 15c.

The plurality of nanowire channels of the multi-bit capacitorless DRAM having the structure of FIG. 15a includes the silicon layer L4, a first epitaxial layer L5 grown by epitaxy, and a second epitaxial layer L6 grown by epitaxy. Here, the first epitaxial layer L5 may be a $Si_{1-x}C_x$ layer, and the second epitaxial layer L6 may be a silicon layer grown by epitaxy.

More specifically, as shown in FIGS. 16a to 16c, the first epitaxial layer L5 is deposited in the form of surrounding the silicon layer L4. The second epitaxial layer L6 is deposited in the form of surrounding the first epitaxial layer L5.

Unlike the foregoing $Si_{1-x}Ge_x$ layer, the $Si_{1-x}C_x$ layer has a characteristic that the band gap $E_g$ becomes wider with the increase of the mixing ratio (x) of carbon. Therefore, the excess holes generated by the impact ionization 9 cannot exceed an energy barrier owned by the first epitaxial layer L5 using $Si_{1-x}C_x$, and thus, the excess holes can be more effectively accumulated in the quantum well.

As compared with a case where the quantum well is not included (FIG. 13a), the quantum well formed by the first epitaxial layer L5 using $Si_{1-x}C_x$ has advantages in that an energy band diagram is much deeper and the change range of the energy level is greater. Therefore, the excess holes generated by the impact ionization 9 can be more effectively accumulated in the quantum well.

Furthermore, as compared with a case where the multi-bit capacitorless DRAM does not include the first epitaxial layer L5 using $Si_{1-x}C_x$ (FIG. 13), the multi-bit capacitorless DRAM including the first epitaxial layer L5 using $Si_{1-x}C_x$ is able to maintain the accumulation of the excess holes for a longer period of time, so that the sensing window, retention time, and endurance, etc., i.e., the main characteristics of the memory can be enhanced.

According to the multi-bit capacitorless DRAM according to the embodiments of FIGS. 14a and 15a, a material such as $Si_{1-x}Ge_x$ having a narrow band gap $E_g$ or $Si_{1-x}C_x$ having a wide band gap $E_g$, etc., is deposited on the silicon layer by an epitaxy process and is used as the quantum well, so that the excess holes are effectively accumulated in the nanowire channel and more improved performance can be obtained.

FIG. 17a shows a structure in which the performance of accumulating the excess holes is improved by using an ion implantation method. FIG. 17b shows separately only one nanowire channel of the structure of FIG. 17a. The energy band diagram of FIG. 17b is shown in FIG. 17c. Through the embodiment of FIGS. 17a to 17c, the above-described effect can be obtained through the ion implantation.

The plurality of nanowire channels included in the multi-bit capacitorless DRAM shown in FIG. 17a include a first silicon layer L7 and a second silicon layer L8. The first silicon layer L7 is a silicon layer p-type doped from n-type by the ion implantation process. The first silicon layer L7 can be formed by implanting an n-type ion such as P, As, etc., into the silicon layer L8 of the nanowire channel to a certain depth.

P-type valence band energy is higher than n-type valence band energy. This fact is used as the energy barrier, so that the excess holes can be efficiently accumulated. In other words, the excess holes cannot exceed the energy barrier created by an n-type semiconductor and are accumulated in the body of the nanowire channel.

Furthermore, as compared with a case where the multi-bit capacitorless DRAM does not include the n-type silicon layer L7 (structure of FIG. 13a), the multi-bit capacitorless DRAM according to the embodiment of the present invention, which includes the n-type silicon layer L7, is able to maintain the accumulation of the excess holes for a longer period of time, so that the sensing window, retention time, and endurance, etc., i.e., the main characteristics of the memory can be enhanced.

Meanwhile, the method for manufacturing the multi-bit capacitorless DRAM according to the embodiment of the present invention includes all of the steps of FIG. 12 as they are, and the step S250 may further include additional processes.

That is, in step S250 of FIG. 12, the plurality of nanowire channels are processed to have different threshold voltages, and the step S250 may further include a process of forming the first epitaxial layer and the second epitaxial layer in each of the plurality of nanowire channels.

Here, the first epitaxial layer is a $Si_{1-x}Ge_x$ layer or a $Si_{1-x}C_x$ layer which surrounds the nanowire channel and is grown by epitaxy. Also, the second epitaxial layer is a silicon layer which surrounds the first epitaxial layer and is grown by epitaxy.

In another embodiment, all of the steps of FIG. 12 are included and the step S250 may further include additional processes.

That is, in step S250 of FIG. 12, the plurality of nanowire channels are processed to have different threshold voltages, and the step S250 may further include an additional process of forming the n-type silicon layer by implanting an n-type ion such as P, As, etc., into the silicon layer of each of the plurality of nanowire channels to a certain depth.

As a result, it is possible to manufacture the multi-bit capacitorless DRAM according to the first to third embodiments. Therefore, the sensing window, retention time, and endurance, etc., i.e., the main characteristics of the memory can be enhanced.

The features, structures and effects and the like described in the embodiments are included in one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A multi-bit capacitorless DRAM comprising:
   a substrate;
   a source and a drain formed on the substrate;
   a plurality of nanowire channels formed on the substrate;
   a gate insulation layer formed in the plurality of nanowire channels; and
   a gate formed on the gate insulation layer,
      wherein two or more nanowire channels among the plurality of nanowire channels have different threshold voltages.

2. The multi-bit capacitorless DRAM of claim 1, wherein the two or more nanowire channels have different threshold voltages by changing at least one of a kind, depth, concentration, and angle of a doped ion.

3. The multi-bit capacitorless DRAM of claim 1, wherein the two or more nanowire channels have different threshold voltages by changing a shape or area of the cross-section of each of the nanowire channels.

4. The multi-bit capacitorless DRAM of claim 1, wherein the two or more nanowire channels have different shapes or areas of the cross-sections thereof by changing at least one of a kind and a concentration of an etching material, an etching time period, a degree of a vacuum, and an etching temperature.

5. The multi-bit capacitorless DRAM of claim 1, wherein each of the nanowire channels comprises:
   a silicon layer;
   a first epitaxial layer which is formed to surround the silicon layer; and
   a second epitaxial layer which is formed to surround the first epitaxial layer.

6. The multi-bit capacitorless DRAM of claim 5, wherein the first epitaxial layer is a $Si_{1-x}Ge_x$ layer grown by epitaxy.

7. The multi-bit capacitorless DRAM of claim 5, wherein the first epitaxial layer is a $Si_{1-x}C_x$ layer grown by epitaxy.

8. The multi-bit capacitorless DRAM of claim 5, wherein the second epitaxial layer is a silicon layer grown by epitaxy.

9. The multi-bit capacitorless DRAM of claim 1, wherein each of the nanowire channels comprises:
   a first silicon layer; and
   a second silicon layer which is formed to surround the first silicon layer.

10. The multi-bit capacitorless DRAM of claim 9, wherein the first silicon layer is a silicon layer p-type doped from n-type by an ion implantation process.

11. The multi-bit capacitorless DRAM of claim 9, wherein the second silicon layer is a p-type silicon layer into which an ion is not implanted.

12. The multi-bit capacitorless DRAM of claim 1, further comprising:

a controller which controls operations of the multi-bit capacitorless DRAM; and a storage unit which stores a driving voltage for each of the plurality of nanowire channels, wherein the driving voltage is based on threshold voltages of the plurality of nanowire channels, wherein the controller controls a driving voltage which is applied to at least one of the gate and the drain, and programs or erases two or more bit data.

13. A method for manufacturing a multi-bit capacitorless DRAM, the method comprising:
    (a) depositing a hard mask on a substrate;
    (b) etching at least a portion of the hard mask;
    (c) patterning a nanowire on the substrate by anisotropic etching;
    (d) forming a passivation layer on the substrate;
    (e) forming a nanowire channel on the substrate by isotropic etching;
    (f) forming a plurality of the nanowire channels by repeatedly performing the steps (c) to (e); and
    (g) forming a source, a drain and a gate,
       wherein the plurality of nanowire channels are processed to have different threshold voltages respectively by the step (f).

14. The method of claim 13, wherein, in the step (f), every time when each nanowire channel is formed, dopant is implanted with the change of at least one of a kind, depth, concentration, and implantation angle of a doped ion, so that the plurality of nanowire channels have different threshold voltages respectively.

15. The method of claim 13, wherein, in the step (f), every time when each nanowire channel is formed, at least one of a kind and concentration of an etching material, etching time period, a degree of a vacuum, and an etching temperature is changed, so that the plurality of nanowire channels have different threshold voltages respectively.

16. The method of claim 13, wherein, in the step (f), a first epitaxial layer and a second epitaxial layer are formed in the plurality of nanowire channels.

17. The method of claim 16, wherein the first epitaxial layer is a $Si_{1-x}Ge_x$ layer which surrounds the nanowire channel and is grown by epitaxy.

18. The method of claim 16, wherein the first epitaxial layer is a $Si_{1-x}C_x$ layer which surrounds the nanowire channel and is grown by epitaxy.

19. The method of claim 13, wherein the second epitaxial layer is a silicon layer which surrounds the first epitaxial layer and is grown by epitaxy.

20. The method of claim 13, wherein, in the step (f), an n-type silicon layer is formed in each of the plurality of nanowire channels by an ion implantation process.

* * * * *